US007553368B2

(12) United States Patent
Butcher et al.

(10) Patent No.: US 7,553,368 B2
(45) Date of Patent: Jun. 30, 2009

(54) PROCESS FOR MANUFACTURING A GALLIUM RICH GALLIUM NITRIDE FILM

(75) Inventors: Kenneth Scott Alexander Butcher, Miranda (AU); Trevor Lionel Tansley, Putney (AU); Afifuddin, Kupang (ID)

(73) Assignee: Gallium Enterprises Pty Ltd. (AU)

( * ) Notice: Subject to any disclaimer, the term of this patent is extended or adjusted under 35 U.S.C. 154(b) by 356 days.

(21) Appl. No.: 10/514,772

(22) PCT Filed: May 19, 2003

(86) PCT No.: PCT/AU03/00598

§ 371 (c)(1),
(2), (4) Date: Jun. 20, 2005

(87) PCT Pub. No.: WO03/097532

PCT Pub. Date: Nov. 27, 2003

(65) Prior Publication Data

US 2006/0174815 A1    Aug. 10, 2006

(30) Foreign Application Priority Data

May 17, 2002    (AU) ................................. PS2404

(51) Int. Cl.
*C30B 25/12* (2006.01)

(52) U.S. Cl. .................. 117/86; 117/108; 118/723 VE; 148/DIG. 1; 148/DIG. 4

(58) Field of Classification Search ............ 148/DIG. 3, 148/DIG. 4, DIG. 1; 117/86, 108, 200; 438/509, 438/902, 903; 118/723 VE
See application file for complete search history.

(56) References Cited

U.S. PATENT DOCUMENTS 4,448,633 A    5/1984    Shuskus .................... 156/640

(Continued)

FOREIGN PATENT DOCUMENTS

CN    1219614    6/1999

(Continued)

OTHER PUBLICATIONS

Alexandrov, D. et al., "Absorption and Photoluminescence Features Caused by Defects in InN", Journal of Crystal Growth, vol. 269, pp. 77-86, (2004).

(Continued)

*Primary Examiner*—Felisa C Hiteshew
(74) *Attorney, Agent, or Firm*—Knobbe Martens Olson & Bear, LLP

(57) ABSTRACT

A process for the manufacture of a gallium rich gallium nitride film is described. The process comprises (a) preparing a reaction mixture containing a gallium species and a nitrogen species, the gallium species and the nitrogen species being selected such that, when they react with each other, gallium nitride is formed; and (b) growing the gallium rich gallium nitride film from the reaction mixture, by allowing the gallium species to react with the nitrogen species and to deposit gallium nitride on a substrate selected from the group consisting of silicon, glass, sapphire, quartz and crystalline materials having a lattice constant closely matched to gallium nitride, including zinc oxide, optionally with a zinc oxide buffer layer, at a temperature of from about 480° C. to about 900 ° C. and in the presence of a gaseous environment in which the partial pressure of oxygen is less than $10^{-4}$ Torr, wherein the ratio of gallium atoms to nitrogen atoms in the gallium rich gallium nitride film is from 1.01 to 1.20. The invention also provides the option of annealing the gallium rich gallium nitride film at a temperature of from about 20° C. to about 650° C. and for a time sufficient to decrease the resistivity of the film so that it becomes electrically conductive, for instance to a resistivity below 100 ohm·cm.

18 Claims, 9 Drawing Sheets

U.S. PATENT DOCUMENTS

| | | | |
|---|---|---|---|
| 4,911,102 A | | 3/1990 | Manabe |
| 5,306,662 A | * | 4/1994 | Nakamura et al. .......... 438/509 |
| 5,637,146 A | | 6/1997 | Chyi .......................... 117/200 |
| 5,786,233 A | | 7/1998 | Taskar et al. .................. 438/46 |
| 5,986,285 A | | 11/1999 | Yagi |
| 6,057,565 A | | 5/2000 | Yoshida et al. |
| 6,617,235 B2 | | 9/2003 | Iyechika et al. |
| 6,806,507 B2 | | 10/2004 | Ishida |
| 2002/0004254 A1 | | 1/2002 | Miki et al. |
| 2002/0157596 A1 | | 10/2002 | Stockman et al. .............. 117/2 |

FOREIGN PATENT DOCUMENTS

| | | |
|---|---|---|
| JP | 08-325094 A | 12/1996 |
| JP | 9298311 | 11/1997 |
| JP | 10-154831 A | 6/1998 |
| JP | 10178205 | 6/1998 |
| JP | 10-256577 A | 9/1998 |
| JP | 11-087253 A | 3/1999 |
| JP | 2000-306854 A | 11/2000 |
| JP | 2001-298214 A | 10/2001 |
| JP | 2002-026389 A | 1/2002 |
| WO | WO 98/37586 | 8/1998 |

OTHER PUBLICATIONS

Butcher, et al., "A Luminescence Study of Porous Diatoms", Materials Science and Engineering C vol. 25, pp. 658-663, (2005).

Butcher et al., "An Instrumental Solution to the Phenomenon of Negative Capacitances in Semiconductors", Solid-St. Electron. vol. 39, pp. 333-336, (1996).

Butcher et al., "Cathodoluminescence of GaSb/GaAs Self Assembled Quantum Dots Grown by MOCVD", Materials Letters vol. 58, pp. 80-83, (2003).

Butcher, et al., "Crystal Size and Oxygen Segregation for Polycrystalline GaN" Journal of Applied Physics vol. 92, pp. 3397-3403, (2002).

Butcher, et al., "Detailed Analysis of Absorption Data for InN", Materials Science in Semiconductor Processing vol. 6, pp. 351-354, (2003).

Butcher, et al., "Gallium and Oxygen Accumulations on GaN surfaces following argon ion milling in ultra-high vacuum conditions", Applied Surface Science vol. 230, pp. 18-23, (2004).

Butcher, InN, a Historical Review—From Obscurity to Controversy.

Butcher, et al., "InN, Latest Development and a Review of the Bandgap Controversy", Superlattices and Microstructures vol. 38, pp. 1-37, (2005).

Butcher, et al., "Multilayer GaSb/GaAs Self-Assembled Quantum Dots Grown by Metalorganic Chemical Vapor Deposition", Materials Chemistry and Physics vol. 81, pp. 8-10, (2003).

Butcher, et al., "Nitrogen Rich Indium Nitride", Journal of Applied Physics vol. 95, pp. 6124-6128, (2004).

Butcher et al., "Non-stoichiometry and Non-homogeneity in InN" Physica Status Solidi. No. 7, pp. 2263-2266, (2005).

Butcher, et al., "Optical and Structural Analysis of GaN Grown by Remote Plasma Enhanced Laser Induced Chemical Vapor Deposition", Physical Status Solidi., No. 1, pp. 499-503, (2002).

Butcher, et al., "Photolytic Absorbate Removal During the Growth of Aluminium Nitride by Remote Microwave Plasma Chemical Vapor Deposition", Solid-St. Electron. vol. 41, pp. 305-314, (1997).

Butcher, et al., "Pre-deposition UV Treatment for Adhesion Improvement of Thin Films on Mercury Cadmium Telluride", J. Vac. Sci. Tech., vol. 19, pp. 90-96, (2001).

Butcher, et al., "Recrystallization prospects for freestanding low temperature GaN grown using ZnO buffer layers", Journal of Crystal Growth, vol. 246, pp. 237-243, (2002).

Butcher, "Revisiting Electrochromism in InN", Physica Status Solidi., No. 7, pp. 2293-2296, (2005).

Butcher et al., "Studies of the Plasma Related Oxygen Contamination of Gallium Nitride Grown by Remote Plasma Enhanced Chemical Vapour Deposition", Physical Status Solidi., No. 1, pp. 156-160, (2002).

Butcher, et al., "Ultra-High Resistivity Aluminium Nitride Deposited on Mercury Cadmium Telluride", J. Appl. Phys. vol. 90, pp. 6217-6221, (2001).

Butcher, et al., "Ultraviolet Raman and Optical Transmission Studies of RF Sputtered Indium Nitride", Physical Status Solidi., No. 1, pp. 373-376, (2002).

Butcher, et al., "UV Moderation of Nitride Films During Remote Plasma Enhanced Chemical Vapour Deposition", Physical Status Solidi., vol. 188, No. 2, pp. 667-671, (2001).

Butcher et al., "X-ray Photoelectron Spectroscopy Depth Profiling of Aluminium Nitride Thin Films", Surf. Interface Anal., vol. 25, pp. 99-104, (1997).

Egan et al., "Hydrogenation Passivation of Acceptors in MOCVD Grown p-InSb", Sol. St. Commun., vol. 98, No. 8, pp. 751-754, (1996).

Godlewski et al., "Atomic layer deposition of ZnO thin films and dot structures", Proceedings of the Estonian Academy of Sciences. Physics, Mathematics, vol. 52, No. 3, pp. 277-288, (2003).

Godlewski et al., "Cathodoluminescence Investigation of Interfaces in InGaN/GaN/ Sapphire Structures", Physical Status Solidi., vol. 228, No. 1, pp. 179-182, (2001).

Goldys et al., "Spatial Fluctuations and Localisation Effects in Optical Characteristics of p-doped GaN Films", Physica Status Solidi., vol. 228, No. 2, pp. 365-369, (2001).

Guy et al., "Piezoelectricity in Indium Nitride", Journal of Crystal Growth vol. 269, pp. 72-76, (2004).

Kuball et al., "A Raman spectroscopy study on InN", Journal of Crystal Growth, vol. 269, pp. 59-65, (2004).

Kuball et al., "Resonant Raman Spectroscopy on InN", Physical Status Solidi., vol. 202, No. 5, pp. 763-767. (2005).

Ramelan et al., "High Resolution X-ray Photoelectron Spectroscopy of AlGaSb", Applied Surface Science, vol. 229, pp. 263-267, (2004).

Shrestha et al, "Accurate Stoichiometric analysis of Polycrystalline Indium Nitride Films with Elastic Recoil Detection", Current Applied Physics, vol. 4, pp. 237-240, (2004).

Shrestha et al., "Nitrogen Depletion of Indium Nitride Films During Elastic Recoil Detection Analysis", Nuclear Instruments and Methods in Physics Research B, vol. 234, pp. 291-307, (2005).

Shrestha et al., "Reliable ERD analysis of group-III nitrides despite severe nitrogen depletion", Nuclear Instruments and Methods in Physics Research B, vol. 219-220, pp. 686-692, (2004).

Shubina et al., "Optical Properties of InN with Stoichiometry Violation and Indium Clustering", Physica Status Solidi., vol. 202, No. 3, pp. 377-382, (2005).

Wintrebert-Fouquet et al., "High sensitivity, high resolution X-ray photoelectron analysis of InN", Phys. Stat. Sol., No. 7, pp. 2785-2789, (2003).

Wintrebert-Fouquet et al., "High-sensitivity X-ray photoelectron spectroscopy characterization of a quantum device structure", Journal of Vacuum Science and Technology, vol. 38, pp. 2131-2133, (2002).

Wintrebert-Fouquet et al., "InN grown by remote plasma enhanced chemical vapor deposition" Journal of Crystal Growth, vol. 269, pp. 134-138, (2004).

Yodo et al., "Visible Emissions Near 1.9-2.2 eV From Hexagonal InN Films Grown By Electron Cyclotron Resonance Plasma-Assisted Molecular-Beam Epitaxy", Journal of Crystal Growth, vol. 269, pp. 145-154, (2004).

Zhou et al., "Growth Mechanisms in Excimer Laser Photolytic Deposition of Gallium Nitride at 500° C.", J. of Crystal Growth, vol. 160, pp. 201-206, (1996).

Zhou et al, "Growth of GaN Films by Combined Laser and Microwave Plasma Enhanced Chemical Vapour Deposition", J. Crystal Growth, vol. 151, pp. 249-253, (1995).

Zhou et al., "Microwave Plasma Assisted LCVD Growth and Characterisation of GaN", Applied Surface Science, 100/101, pp. 643-646, (1996).

Zhou et al., "Photoconductive Decay in LCVD/PECVD Low Temperature Grown GaN", Solid-St. Electronics, vol. 41, No. 2, pp. 279-281, (1997).

Supplementary Partial European Search Report for corresponding EP 03724623.8 dated May 2, 2008.

Zhonghai Yu et al., "The effect of atomic hydrogen on the growth of gallium nitride by molecular beam epitaxy", Appl. Phys. Lett 69 (18), Oct. 28, 1996, pp. 2731-2733.

Sakae Zembutsu et al., "Growth of GaN single crystal films using electron cyclotron resonance plasma excited metalorganic vapor phase epitaxy", Appl. Phys. Lett 48 (13), Mar. 31, 1986, pp. 870-872.

K. S. A. Butcher et al., "Glass Substrates for GaN Using ZnO buffer Layers", 2000 IEEE, pp. 535-538.

H.Y. Zuo et al., "The influence of different substrates on GaN films grown by low temperature laser and plasma enhanced MOCVD", 1997 IEEE, pp. 406-409.

* cited by examiner

PROCESS FOR MANUFACTURING A GALLIUM RICH GALLIUM NITRIDE FILM

TECHNICAL FIELD

The present invention relates to the manufacture of materials suitable for use in lasers; ultraviolet light detectors and high power microwave transistor devices. More particularly, the invention relates to a process for the manufacture of a gallium nitride film and to a gallium nitride film manufactured by the process.

BACKGROUND OF THE INVENTION

Gallium nitride is a material widely used in the construction of blue, violet and white light emitting diodes, blue laser diodes, ultraviolet detectors and high power microwave transistor devices.

Present gallium nitride device technology is based on what in the literature is nominally described as single crystal material, grown at temperatures generally above 950° C., on sapphire or silicon carbide substrates, by metal organic chemical vapour deposition (MOCVD) or molecular beam epitaxy (MBE) techniques. These processes are normally run under conditions which are as near as possible to stoichiometry. It has been found that the closer the reaction mixture is to stoichiometric conditions, the higher the rate of deposition of gallium nitride. Although GaN made using the aforementioned conventional processes includes a large number of defects, it is normally considered single crystal material.

However, substrates made of sapphire or silicon carbide tend to be expensive so that the cost effective application of present devices is limited. Film growth on these foreign substrates also requires growth strategies that reduce defects generated by the mismatch in atomic spacing between the substrate and gallium nitride film. Buffer layers are often used as one strategy, though epitaxial lateral overgrowth (ELOG) represents another more sophisticated strategy. Requirements for greater reduction in defect formation require more sophisticated, more expensive techniques, such as ELOG, be applied. Growth at high temperatures also entails a large expenditure in temperature resistant growth equipment and ancillaries. Considerable savings and expansion in device use can potentially be achieved by lower temperature growth, say below 650° C., on less expensive but temperature sensitive, substrate materials such as silicon, glass or quartz, with or without a buffer layer of ZnO. Growth on ZnO would be advantageous since it is more closely lattice matched to GaN, for growth on ZnO temperatures below 650° C. are necessary. However, it is well known that GaN material grown at such low growth temperatures is of lower quality because polycrystalline material is prevalent.

Bour et al (D. P. Bour, N. M. Nickel, C. G. Van de Walle, M. S. Kneissl, B. S. Krusor, Ping Mei, and N. M. Johnson, Appl. Phys. Lett. 76 (2000) 2182) have demonstrated a blue LED fabricated from polycrystalline GaN grown on quartz using a GaN buffer layer. Despite its potential, interest in polycrystalline GaN is small in comparison to that of single crystal material, and the knowledge base for this material is also correspondingly small. Material grown below 650° C. tends to be gallium rich because of the poor desorption of free gallium.

One of the disadvantages of the aforementioned process for the production of gallium nitride above 950° C. is that the process temperature required is high, which results in high energy losses and which requires the use of special materials. Another disadvantage is that the substrates used at these high temperatures are not ideally matched to GaN. Expensive methodologies must therefore be applied to overcome this mismatch in atomic spacing. Other materials such as ZnO would be preferred but can only be accessed at lower temperatures.

OBJECT OF THE INVENTION

It is an object of the present invention to overcome or substantially ameliorate at least one of the above disadvantages.

SUMMARY OF THE INVENTION

According to a first aspect of the present invention, there is provided a process for increasing the conductivity of gallium nitride, comprising:
  annealing the gallium nitride at a temperature and time sufficient to increase the conductivity of the gallium nitride.

The gallium nitride may be single crystal or polycrystalline. Usually the gallium nitride is initially polycrystalline but after annealing has larger crystals or becomes a single crystal.

According to a second aspect of the present invention, there is provided a process for increasing the crystal size of polycrystalline gallium nitride, comprising:
  annealing the gallium nitride at a temperature and time sufficient to increase the crystallinity of the gallium nitride.

According to a third aspect of the present invention, there is provided a process for increasing the crystal size and conductivity of polycrystalline gallium nitride, comprising:
  annealing the gallium nitride at a temperature and time sufficient to increase the crystal size and conductivity of the gallium nitride.

The gallium nitride film may be gallium rich.

The gallium nitride may be an independent crystal or it may be a layer on a substrate. After annealing the gallium nitride may serve as a substrate.

The temperature during the annealing step may be in the range of 20° C. to 700° C.

According to a fourth aspect of the present invention, there is provided a process for the manufacture of gallium nitride, comprising:
  growing gallium rich gallium nitride on a substrate such as silicon, glass or quartz, optionally with a buffer layer of ZnO, at a temperature of from about 480° C. to about 650° C. to form a polycrystalline material; and
  annealing the said polycrystalline material at an temperature of from about 20° C. and about 700° C. for a time sufficient to increase the conductivity of the polycrystalline material.

According to a fifth aspect of the present invention, there is provided a process for the manufacture of gallium nitride, comprising:
  growing gallium rich gallium nitride on a substrate such as silicon, glass or quartz, with or without a buffer layer of ZnO, at a temperature of from about 480° C. to about 650° C. to form a polycrystalline material; and
  annealing the gallium nitride at a temperature and time sufficient to increase the crystal size of the gallium nitride.

The conductivity of the GaN after annealing may be in the range of 0.01 ohm·cm to 150 ohm·cm or 0.1 ohm·cm to 90 ohm·cm. However, conductivities less than 150 ohm·cm (e.g.

in the range 151 ohm·cm to 250 ohm·cm) may be achieved by appropriate manipulation of the annealing time and/or temperature.

The process according to the invention may conveniently include the deposition of gallium nitride from a reaction mixture containing gallium and nitrogen.

As one alternative, a suitable laser may be used to induce the deposition of gallium nitride from the reaction mixture. As another alternative, a remote plasma may be used to cause the deposition of gallium nitride from the reaction mixture. As a preferred alternative, a combination of the laser induced and remote plasma enhanced technologies is used to promote the rapid deposition of gallium nitride at high efficiencies.

The annealing temperature range may be 50° C. to 500° C., or 50° C. to 400° C., or 75° C. to 300° C. or 75° C. to 200° C. or 75° C. to 100° C.

The annealing step may conveniently be carried out over a period long enough to obtain gallium nitride having crystallographic characteristics acceptable for use in a laser device.

According to a sixth aspect of the invention, there is provided gallium nitride having increased conductivity and/or crystallinity made by the process according to the invention.

According to a seventh aspect of the invention, there is provided gallium nitride manufactured by the process according to the invention.

Gallium nitride films may be grown on silicon substrates, optionally with a zinc oxide buffer layer. Growth temperatures between 500 and 650 degrees Celsius may be used.

The process may utilise a laser to photolytically dissociate ammonia and trimethylgallium film precursors.

Additional active nitrogen may be provided by a remote nitrogen or ammonia plasma maintained at microwave frequencies.

The film may be grown under conditions well removed from stoichiometric conditions, so that a gallium rich film may result.

The film may be semi-insulating in the as grown state.

According to an eighth aspect of the invention, there is provided a process for the manufacture of a gallium rich gallium nitride film, comprising:

(a) preparing a reaction mixture containing a gallium species and a nitrogen species, the gallium species and the nitrogen species being selected such that, when they react with each other, gallium nitride is formed; and (b) growing the gallium rich gallium nitride film from said reaction mixture, by allowing the gallium species to react with the nitrogen species and to deposit gallium nitride on a substrate selected from the group consisting of silicon, glass, sapphire, alumina, quartz and crystalline materials having a lattice constant closely matched to gallium nitride, optionally with a buffer layer of zinc oxide (ZnO), at a temperature of from about 480° C. to about 900° C. and in the presence of a gaseous environment in which the partial pressure of oxygen is less than $10^{-4}$ Torr, wherein the ratio of gallium atoms to nitrogen atoms in the gallium rich gallium nitride film is from 1.01 to 1.20.

In the event that silicon or alumina is used as a substrate, it is preferably crystalline.

Zinc oxide may be used as a buffer layer between the substrate and the gallium nitride film. Good results have been achieved using zinc oxide as a buffer layer on lime glass.

According to a ninth aspect of the invention, there is provided a process for the manufacture of a gallium rich gallium nitride film, comprising:

(a) preparing a reaction mixture containing a gallium species and a nitrogen species, the gallium species and the nitrogen species being selected such that, when they react with is each other, gallium nitride is formed; and (b) growing the gallium rich gallium nitride film from said reaction mixture, by allowing the gallium species to react with the nitrogen species and to deposit gallium nitride on a substrate selected from the group consisting of silicon, glass, sapphire and quartz, optionally on a buffer layer of zinc oxide, at a temperature of from about 480° C. to about 650° C. and in the presence of a gaseous environment in which the partial pressure of oxygen is less than $10^{-4}$ Torr, wherein the ratio of gallium atoms to nitrogen atoms in the gallium rich gallium nitride film is from 1.001 to 1.20; and (c) annealing the said film at a temperature of from about 20° C. to about 700° C. for a time sufficient to decrease the resistivity of the gallium rich gallium nitride film to below 1000 ohm·cm.

In step (b), the temperature may be between 480° C. and 650° C. At lower temperatures, the reaction between trimethyl gallium and ammonia proceeds at a lower rate. If the temperature is below 480° C., the rate of the reaction between trimethyl gallium and ammonia becomes too slow which means that the film of gallium nitride that is grown will have sufficient time for it to incorporate oxygen in the film, which is undesirable in view of the need for the gallium atoms to remain mobile. More preferably, the temperature is in the range of 520° C. to 630° C., 540° C. to 610° C., 550° C. to 600° C., 560° C. to 590° C., 565° C. to 585° C., 550° C. to 650° C., 560° C. to 640° C., 570° C. to 600° C., 580° C. to 600° C., 530° C. to 630° C., 550° C. to 600° C., 580° C. to 650° C., 590° C. to 650° C., 590° C. to 640° C., 540° C. to 620° C., ideally in the region of about 570° C.

The growth chamber may be prepared, prior to the introduction of the substrate on which the gallium rich gallium nitride film is to be grown, by purging it with nitrogen, before evacuating the chamber to extract as much air from it as possible. It is also important to prevent any other sources of oxygen from entering the growth chamber or of being present when the film is grown therein. For this reason, the gas in the growth chamber may be extracted by vacuum pumping thereon until the absolute partial pressure of oxygen is less than $1\times10^{-4}$ Torr, preferably less than $1\times10^{-5}$ Torr, more preferably, less than $1\times10^{-6}$ Torr, even more preferably, less than $1\times10^{-7}$ Torr.

In step (b), a laser may be used to induce the deposition on the substrate of the gallium nitride formed by the reaction mixture. Ultraviolet excimer lasers, with photon energy greater than the bonding energy of the precursor molecules, are preferred, though other lasers with lower energy photons, such as infrared YAG lasers, can be used to dissociate the said precursors in a multi-photon process requiring a very high intensity laser beam. An example of an excimer laser is an argon-fluorine gas mixture laser with 192 nm wavelength (6.4 eV) photons. Neon fluorine excimer lasers and other excimer lasers may also be used.

A remote plasma may be used to assist with the deposition of gallium nitride from the reaction mixture. The remote plasma may be generated using nitrogen gas or ammonia vapour. The plasma itself may be excited by an electric field using a high voltage direct current discharge, a radiofrequency electric field or a microwave electric field.

During the annealing step (c), the resistivity of the film may be reduced to less than 250 ohm·cm, preferably to below 90 ohm·cm.

During the annealing step (c), the annealing temperature may be anywhere from about 20° C. and about 700° C., 50° C. to about 650° C., 80° C. to about 700° C., 100° C. to about 700° C., 80° C. to about 600° C., 80° C. to about 550° C., 80° C. to about 500° C., 80° C. to about 450° C., 80° C. to about 400° C., 80° C. to about 350° C., 80° C. to about 300° C., 80° C. to about 250° C., 50° C. to about 250° C., 50° C. to about 300° C., 50° C. to about 350° C., 50° C. to about 400° C.

The annealing step (c) may be carried out for a period long enough to obtain a film having crystallographic characteristics acceptable for use in a laser device. That period may be from a few hours (at higher temperatures within the aforementioned ranges of temperatures), to several months and even years (at lower temperatures within the aforementioned ranges of temperatures). Thus, the period may be from 1 to 8 hours, from 2 to 8 hours, from 2 to 16 hours, from 2 to 24 hours, from 2 hours to 7 days, from 1 day to 30 days, from one month to 24 months or even longer where the annealing step is done at ambient temperature conditions. The exact annealing period is dependent on the oxygen content, excess gallium content and the content of other impurity species in the film.

The annealing step may be carried out until the resistivity of the gallium rich gallium nitride film has been decreased sufficiently for it to become electrically conductive. Thus, the gallium rich gallium nitride film may be annealed at a temperature between about 20° C. and about 650° C. and for a time sufficient to decrease the resistivity of the gallium rich gallium nitride film to below about 1000 ohm·cm.

The resistivity of the gallium rich gallium nitride film may be reduced from about 10000 ohm·cm to about 1000 ohm·cm, alternatively from more than 1000 ohm·cm to less than about 500 ohm·cm, alternatively from more than 1000 ohm·cm to less than about 200 ohm·cm, preferably from more than 1000 ohm·cm to less than about 100 ohm·cm, more preferably from more than 1000 ohm·cm to less than about 80 ohm·cm, more preferably from more than 1000 ohm·cm to less than about 90 ohm·cm, still more preferably from more than 1000 ohm·cm to less than about 50 ohm·cm.

As one example, for a gallium nitride film of which the ratio of gallium to nitrogen was approximately 1.1 a resistivity of about 86 ohm·cm was achieved by annealing at room temperature for about 20 months.

In step (b), the total pressure may be between about 0.1 Torr and about 15 Torr, preferably between about 1.0 Torr and about 2.0 Torr.

The processes according to the invention may be preceded by a step in which the growth chamber is evacuated to an absolute pressure of between $1.0 \times 10^{-5}$ Torr and $1.0 \times 10^{-8}$ Torr, before the reaction mixture is introduced. The growth chamber is preferably purged with nitrogen before it is evacuated to an absolute pressure of between $1.0 \times 10^{-5}$ Torr and $1.0 \times 10^{-8}$ Torr, whereafter the reaction mixture is introduced.

The invention also extends to the products of the processes of the invention.

According to a tenth aspect of the invention, there is provided apparatus for the manufacture of a gallium rich gallium nitride film, comprising:

(a) means for preparing a reaction mixture containing a gallium species and a nitrogen species, the gallium species and the nitrogen species being selected such that, when they react with each other, gallium nitride is formed; and (b) means for growing the gallium rich gallium nitride film from said reaction mixture, by allowing the gallium species to react with the nitrogen species and to deposit gallium nitride on a substrate selected from the group consisting of silicon, glass, sapphire, quartz and crystalline materials having a lattice constant closely matched to gallium nitride, including zinc oxide, at a temperature of from about 480° C. to about 900° C. and in the presence of a gaseous environment in which the partial pressure of oxygen is less than $10^{-4}$ Torr, wherein the ratio of gallium atoms to nitrogen atoms in the gallium rich gallium nitride film is from 1.01 to 1.20.

According to a tenth aspect of the invention, there is provided apparatus for the manufacture of a gallium rich gallium nitride film, comprising:

(a) means for preparing a reaction mixture containing a gallium species and a nitrogen species, the gallium species and the nitrogen species being selected such that, when they react with each other, gallium nitride is formed; and (b) means for growing the gallium rich gallium nitride film from said reaction mixture, by allowing the gallium species to react with the nitrogen species and to deposit gallium nitride on a substrate selected from the group consisting of silicon, glass, sapphire, quartz and crystalline materials having a lattice constant closely matched to gallium nitride, including zinc oxide, at a temperature of from about 480° C. to about 650° C. and in the presence of a gaseous environment in which the partial pressure of oxygen is less than $10^{-4}$ Torr, wherein the ratio of gallium atoms to nitrogen atoms in the gallium rich gallium nitride film is from 1.001 to 1.20; and (c) means for annealing the said film at a temperature of from about 20° C. to about 700° C. for a time sufficient to decrease the resistivity of the gallium rich gallium nitride film to below 1000 ohm·cm.

The apparatus may conveniently comprise means for controlling the temperature in step (b) between 500° C. and 650° C. The means for controlling the temperature in step (b) is preferably capable of controlling the temperature at about 570° C.

The apparatus may also comprise means for controlling the partial pressure of oxygen in step (b) at less than $10^{-6}$ Torr.

The apparatus may further comprise a laser to induce, in step (b), the deposition, on the substrate, of the gallium nitride formed by the reaction mixture.

The apparatus may in addition comprise a remote plasma to assist with the deposition of gallium nitride from the reaction mixture.

The apparatus may in addition comprise means for controlling the annealing temperature during the annealing step (c) between about 50° C. and about 500° C.

The apparatus may further comprise a remote nitrogen plasma maintained at microwave frequencies, to supply additional nitrogen.

The apparatus may further comprise means for providing, in step (b), a total pressure between 0.1 Torr and 15 Torr.

The apparatus may further comprise means for evacuating the growth chamber to an absolute pressure of between $1.0 \times 10^{-5}$ Torr and $1.0 \times 10^{-8}$ Torr, before the reaction mixture is introduced.

The apparatus may further comprise means for purging the growth chamber with nitrogen and means for evacuating the growth chamber to an absolute pressure of between $1.0 \times 10^{-5}$ Torr and $1.0 \times 10^{-8}$ Torr, before the reaction mixture is introduced thereinto.

BRIEF DESCRIPTION OF THE DRAWINGS

Preferred forms of the present invention will now be described, by way of example, with reference to the accompanying drawings wherein.

DETAILED DESCRIPTION OF THE DRAWINGS

FIGS. 1 to 14 are described in relation to the Examples.

Figure 15:
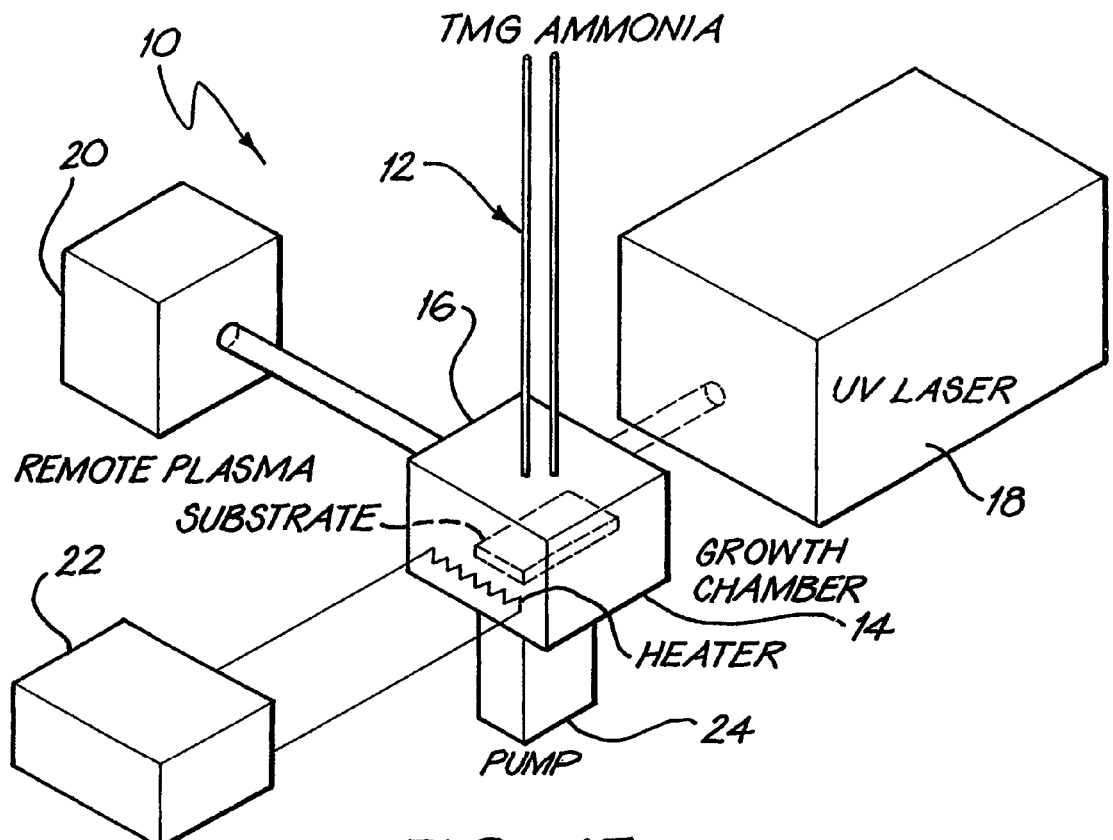
FIG. 15 is a simplified block flow diagram representing an apparatus in accordance with the invention for the manufacture of a gallium rich gallium nitride film.

Referring to FIG. 15, there is shown an apparatus 10 for the manufacture of a gallium rich gallium nitride film. The apparatus comprises means 12 for preparing a reaction mixture containing a gallium species in the form of trimethyl gallium and a nitrogen species in the form of ammonia. The apparatus 10 comprises a growth chamber 14 for growing the gallium rich gallium nitride film from the reaction mixture of trimethyl gallium and ammonia, and to deposit gallium nitride on a quartz substrate 16.

The apparatus further comprises a laser 18 to induce the deposition, on the substrate, of the gallium nitride formed by the reaction mixture.

A remote nitrogen plasma 20 operated at microwave frequencies, to supply additional nitrogen to the growth chamber.

Temperature control means 22 is provided for controlling the temperature in the growth chamber in the range of from about 480° C. to about 900° C.

A vacuum pump 24 is used to evacuate the growth chamber before the reaction mixture is introduced to provide a gaseous environment in which the partial pressure of oxygen is less than $10^{-4}$ Torr. The vacuum pump 24 preferably comprises means for controlling the partial pressure of oxygen in step (b) at less than $10^{-4}$ Torr, preferably less than $10^{-6}$ Torr.

Figure 16:
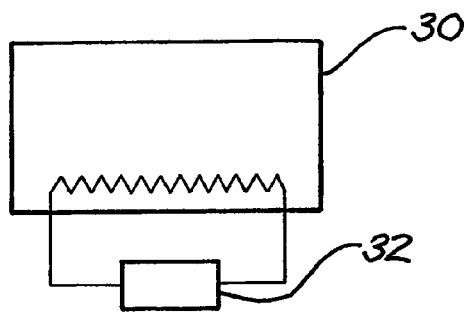
FIG. 16 is a simplified block flow diagram representing an apparatus in accordance with the invention for the annealing of a gallium rich gallium nitride film.

In FIG. 16, annealing means 30 is shown, for annealing the gallium nitride film after it has been grown, at a temperature of from about 20° C. to about 700° C. for a time sufficient to decrease the resistivity of the gallium rich gallium nitride film to below 1000 ohm·cm.

Means 32 is also provided for controlling the annealing temperature of the gallium nitride film between about 50° C. and about 500° C.

In use, a suitable substrate 26 is placed inside the growth chamber 14, it is purged with nitrogen gas to remove as much oxygen as possible, in order to prevent oxygen from being built into the gallium nitride film. The substrate is selected from the group consisting of silicon, glass, alumina, sapphire, quartz and crystalline materials having a lattice constant closely matched to gallium nitride. Because of the somewhat lower operating temperature, a cheap substrate such as glass may be used. In order to improve the crystal structure of the film, a buffer layer such as zinc oxide may conveniently be used between the gallium nitride film and the substrate.

Using the vacuum pump 24, the growth chamber 14 is then evacuated until an oxygen partial pressure of at most $1 \times 10^{-4}$ Torr is obtained, preferably around $1 \times 10^{-6}$ Torr.

Before introducing the ammonia and trimethyl gallium, the growth chamber 14 is heated to an operating temperature of around 570° C., using the temperature control means 22, and the remote plasma 20 and UV laser 18 are put into operation. It is important to ensure that the reagents are as pure as possible, with particularly oxygen concentration to be as low as possible.

When the reaction mixture is introduced, the total pressure in the growth chamber 14 is maintained at 1 to 2 Torr, by using a vacuum control system controlling the vacuum pump 24.

The gallium rich gallium nitride film is then grown from the reaction mixture, by allowing the trimethyl gallium to react with the ammonia so as to deposit gallium nitride on the substrate.

Under the aforementioned conditions, a gallium nitride film may be grown wherein the ratio of gallium atoms to nitrogen atoms is from about 1.01 to about 1.20. It is important to keep the oxygen concentration as low as possible, to ensure that oxides of gallium and/or nitrogen are not built into the film, because that will inhibit migration of the extra gallium in the annealing step.

After the film has been grown, it is annealed in an annealing oven 30, where it is maintained at an annealing temperature, preferably in the absence of oxygen at higher temperatures within the range of about 20° C. to about 700° C. The film is kept in inside the oven 30 for a time sufficient to decrease the resistivity of the gallium rich gallium nitride film to below 1000 ohm·cm. This time will depend on various factors, including the temperature of the oven 30, the concentration of oxygen in the film, the excess of gallium over nitrogen in the film (in other words the extent to which the film is gallium rich), etc.

EXAMPLES

Example 1

Fifteen films of gallium nitride (GaN) were grown at 540° C. on (1,0,0) silicon, using a remote plasma enhanced laser induced chemical vapour deposition (RPE-LICVD) technique. The quality of films grown using the aforementioned technique may be comparable to MBE grown material with unintentionally doped n-type material being produced with room temperature mobilities as high as 100-200 cm²/V·s [1].

A high vacuum system was used for the film growth, and the oxygen content of the films was moderated by controlling the background pressure prior to growth. From $1\times10^{-4}$ Torr, to $2\times10^{-6}$ Torr dependent on the condition of the chamber at the time of growth.

The samples were all grown under similar conditions—apart from the variation in the background vacuum level as mentioned before.

Of the fifteen films grown, three samples, which spanned the range of background vacuum levels used, were subjected to ERD analysis, as outlined below. These three samples were respectively labelled A, B and C. The three samples were representative of the larger group of fifteen. The morphology for the three samples was studied and the results are reflected in the drawings and tables referred to hereinbelow.

The GaN films were grown on silicon substrates that had previously been degreased and dip etched in $HF:H_2O$ 1:10 solution, rinsed in 18 $M\Omega\cdot cm$ $H_2O$ and then dried under nitrogen gas flow.

TABLE 1

Atomic film content determined by ERD analysis of the three GaN films, the background pressure of the growth rig is also indicated for each of the sample films.

|  | Sample A | Sample B | Sample C |
|---|---|---|---|
| Ga atomic % | 41.3 ± 0.4 | 40.6 ± 2.0 | 47.5 ± 2.0 |
| N atomic % | 25.8 ± 0.3 | 42.1 ± 2.0 | 43.0 ± 2.0 |
| O atomic % | 22.0 ± 0.4 | 9.5 ± 1.0 | 2.4 ± 0.5 |
| C atomic % | 2.6 ± 0.2 | 4.8 ± 1.0 | 3.9 ± 0.5 |
| H atomic % | 8.3 ± 0.1 | 3.0 ± 0.5 | 3.2 ± 0.5 |
| Background chamber pressure prior to growth | $1\times10^{-4}$ Torr | $5\times10^{-6}$ Torr | $2\times10^{-6}$ Torr |

As can be seen in Table 1, Sample A had an oxygen concentration of 22.0 at-%, whilst the oxygen concentrations of Samples B and C were respectively 9.5 and 2.4 at-%.

These conditions produced Ga rich material under low pressure when the oxygen concentration is low.

XRD was carried out using a Siemens D5000 X-ray Diffractometer, while the AFM results were measured using a Park Scientific Instruments AutoProbe in the contact mode. The EDS spectra were collected with a Philips XL30ESEM environmental SEM.

After growth, the three sample films, A, B and C, were submitted to the ANU where a unique system for ERD analysis using heavy ion beams is available. This system is particularly suited to the detection and quantitative analysis of light elements such as nitrogen, oxygen and hydrogen. The use of this system was of interest because of its high detection efficiency and the promise of lower ion damage during beam exposure. Previous experience with a different type of heavy ion ERD set-up, with lower detection efficiency, had resulted in severe nitrogen loss under heavy ion beam bombardment so that accurate compositional analysis could not be carried out.

For the ERD measurements a beam of 200 MeV $^{197}Au$ ions from the ANU 14UD Pelletron accelerator was used. Recoil ions, including hydrogen, were detected at 45° relative to the beam direction using a large detection solid angle (3.5 ms) gas ionisation detector. The angle between sample normal and beam direction was 112.5°. Kinematic energy broadening over the acceptance angle was corrected using the position information provided by the detector [2]. For sample A the film/substrate interface was well resolved so that the film composition could be determined directly with excellent accuracy by normalising the detected recoil yields with the Rutherford scattering cross-section. The film/substrate interface was not resolved for samples B and C, since the films were thicker than the probing depth of the technique, which is $\sim10^{19}$ at/cm$^2$ for this material. A direct comparison of the yields was thus not possible. However, film compositions have been determined by adapting simulations to the measured energy spectra. The hydrogen spectra for the films were analysed by comparing them with that obtained for a Kapton film with constant H content [3].

Figure 1:
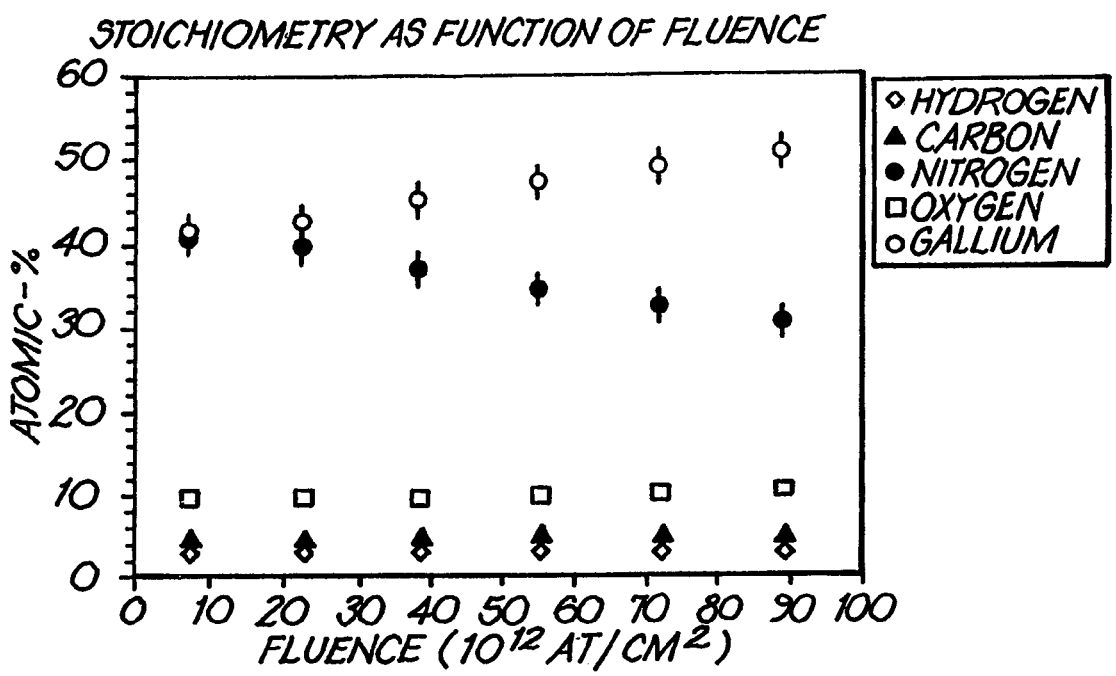
FIG. 1 shows the elemental content (in atomic percent) as a function of beam fluence for a gallium nitride sample B obtained from Example 1.
Figure 2:
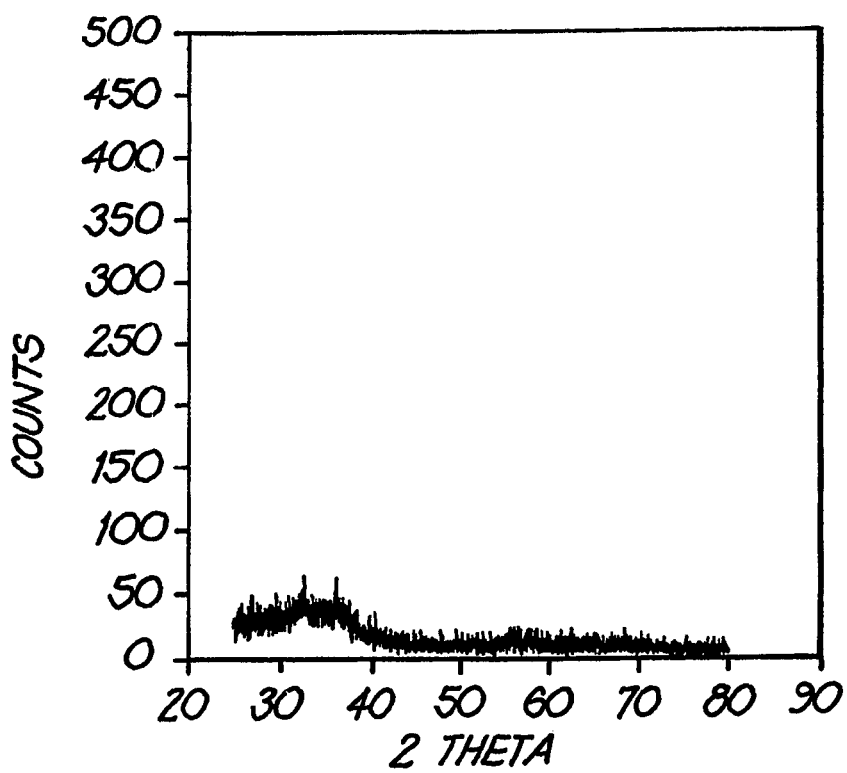
FIG. 2 is an X-ray diffraction spectrum for a gallium nitride sample A also obtained from Example 1.

An example of the ERD results is shown in FIG. 1 for sample B, a breakdown of the sample compositions is also shown in table 1. For all three films the stoichiometry changes linearly with the fluence of incident $^{197}Au$ ions, which can be attributed to the beam induced desorption of the volatile elements nitrogen and hydrogen. The initial composition of the films was therefore determined by linear extrapolation to zero ion fluence.

The XRD and AFM results, for the samples are shown in FIGS. 2-4 and 5-7 respectively. The two small peaks in FIG. 2, at 32.2 and 36.1 2θ degrees are attributed to the film. Their small size (a 3 hour data collection period was used for all the XRD spectra) and broadness indicates that the film is composed of small crystallites. The peak at 36.1 may be due to the ($10\bar{1}1$) peak of GaN (quoted as being at 36.96 2θ degrees—see table 2), while the peak at 32.2 may be due to the ($10\bar{1}0$) reflection of gallium nitride. Table 2 lists some common peak positions for gallium nitride related compounds.

TABLE 2 positions for Miller-Bravias Indices of common Ga containing species using Cu-kα radiation close to those values observed for the present XRD spectra. Adapted from the JCPDS-ICDD PDF-2 database.

| $\beta$-$Ga_2O_3$ (Monoclinic) | | $Ga(OH)_3$ (cubic) | | GaN (hexagonal) | |
|---|---|---|---|---|---|
| Indices | 2θ | Indices | 2θ | Indices | 2θ |
| ($\bar{1}$02) | 19.08 | (200) | 23.772 | ($10\bar{1}0$) | 32.412 |
| (102) | 24.32 | (220) | 34.062 | (0002) | 34.605 |
| ($\bar{2}$02) | 31.27 | (310) | 38.101 | ($10\bar{1}1$) | 36.963 |
| ($\bar{1}$11) | 33.52 | (222) | 41.989 | ($10\bar{1}2$) | 48.267 |
| (111) | 35.24 | (321) | 45.450 | ($11\bar{2}0$) | 57.915 |
| (104) | 37.54 | (400) | 48.735 | ($10\bar{1}3$) | 63.639 |
| ($\bar{1}$13) | 38.40 | (420) | 54.972 | ($20\bar{2}0$) | 67.750 |
| ($\bar{2}$11) | 43.00 | (422) | 60.678 | ($11\bar{2}2$) | 69.173 |
| ($\bar{1}$06) | 44.87 | | | ($20\bar{2}1$) | 70.602 |
| ($\bar{2}$13) | 45.88 | | | (0004) | 73.000 |
| (015) | 48.72 | | | | |
| ($\bar{2}$06) | 49.68 | | | | |
| ($\bar{3}$04) | 50.99 | | | | |
| (106) | 52.69 | | | | |
| (302) | 54.70 | | | | |
| ($\bar{3}$11) | 56.60 | | | | |
| ($\bar{3}$13) | 57.69 | | | | |

Figure 3:
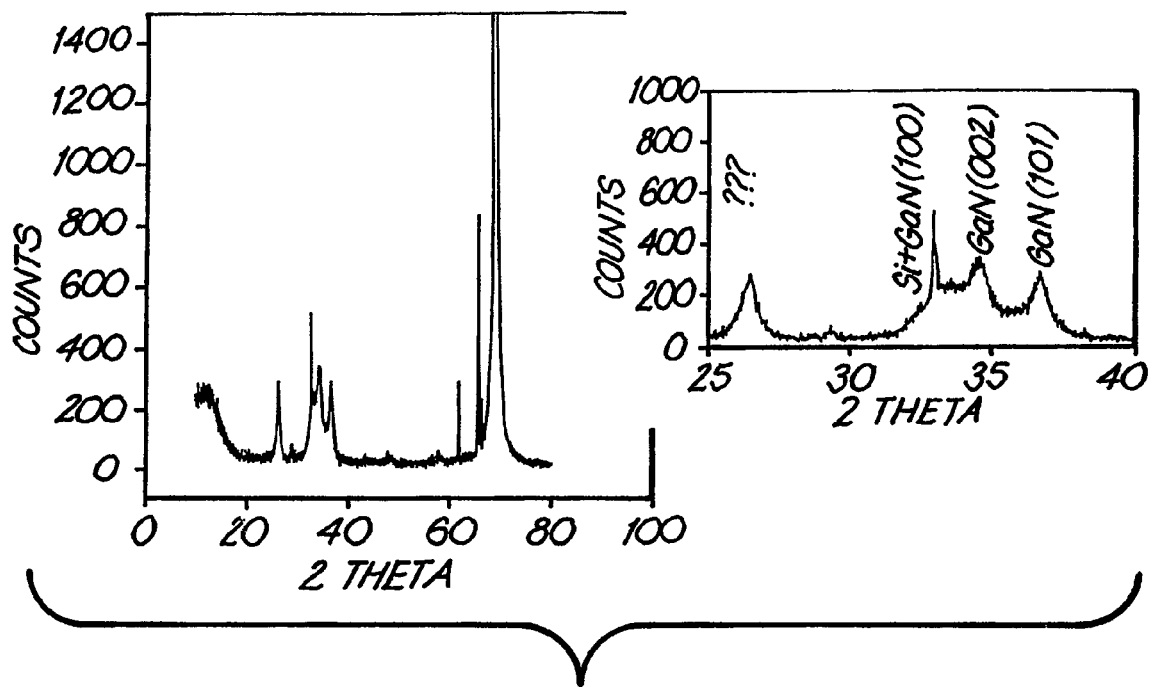
FIG. 3 is an X-ray diffraction spectrum for the gallium nitride sample B obtained from Example 1.

The XRD spectrum of sample B is shown in FIG. 3. The inset in FIG. 3 shows a smaller 2θ region where the GaN peaks dominate. A narrower spectral range is shown in the inset of the Figure for this sample, since some interference from Si peaks is evident at the higher peak angles and since the major peaks of interest are all in one area. In fact a small Si substrate peak is still present on top of a GaN peak at 32.96 2θ degrees, recognisable by its narrowness compared to the GaN peaks. This sample shows several prominent gallium nitride related peaks at 33.0, 34.6 and 36.7 2θ degrees. The presence of these multiple GaN reflections indicates polycrystalline material with multiple crystal orientation. Another unknown peak is present at a lower angle (26.45 2θ degrees) and may be due to the incorporated oxygen.

Figure 4:
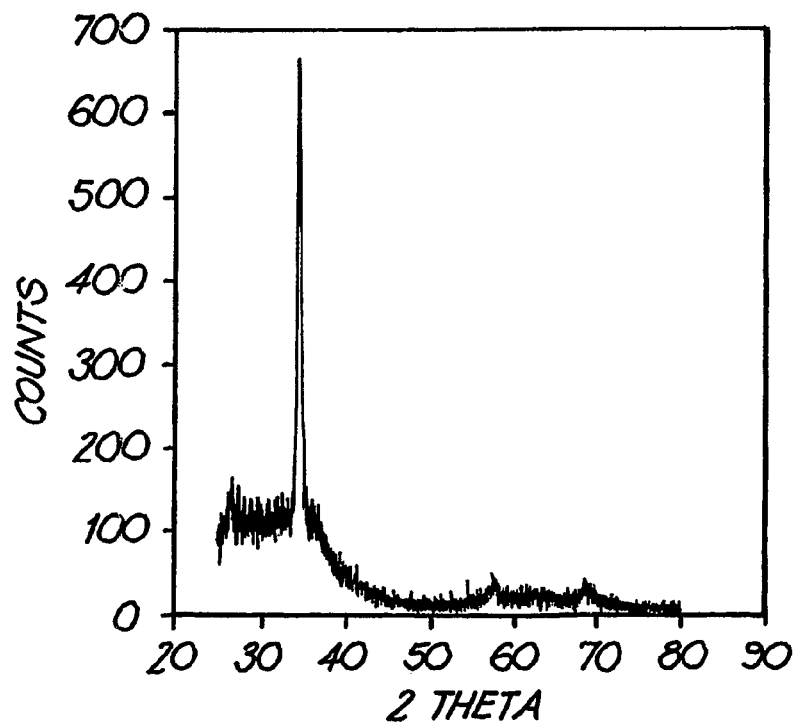
FIG. 4 is an X-ray diffraction spectrum for a gallium nitride sample C also obtained from Example 1.

For sample C the XRD spectrum of FIG. 4 shows that the multi-orientation observed for sample B has largely disappeared. A single strong peak is evident at 34.4 2θ degrees, which is the (0002) reflection of GaN. The presence of this reflection indicates predominantly (0001) oriented material with the hexagonal structure c-axis aligned normal to the (100) cubic silicon surface. The predominant (0002) peak indicates that the c-axis is oriented perpendicular to the surface of the substrate. Some small GaN peaks at 57.7 and 68.6 2θ degrees indicate the presence of a small amount of crystal multi-orientation, although the (0001) orientation clearly dominates. The unknown peak at 26.45 2θ degrees, most probably a gallium-nitrogen-oxygen compound is also still present in this spectrum, though again at a much lower intensity than the (0002) reflection.

Figure 5:
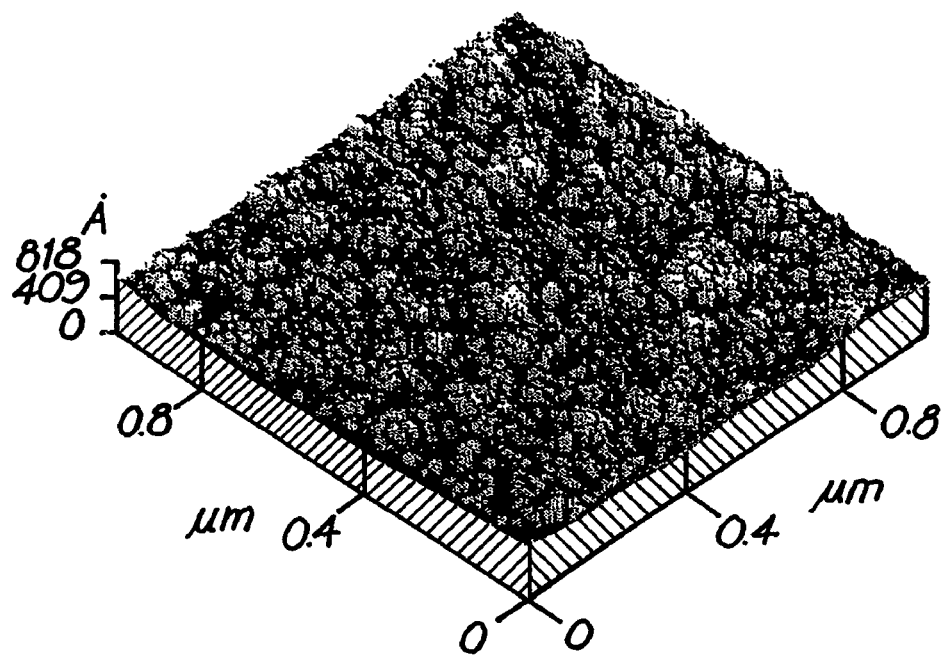
FIG. 5 shows an atomic force microscopy surface map of the gallium nitride sample A.
Figure 6:
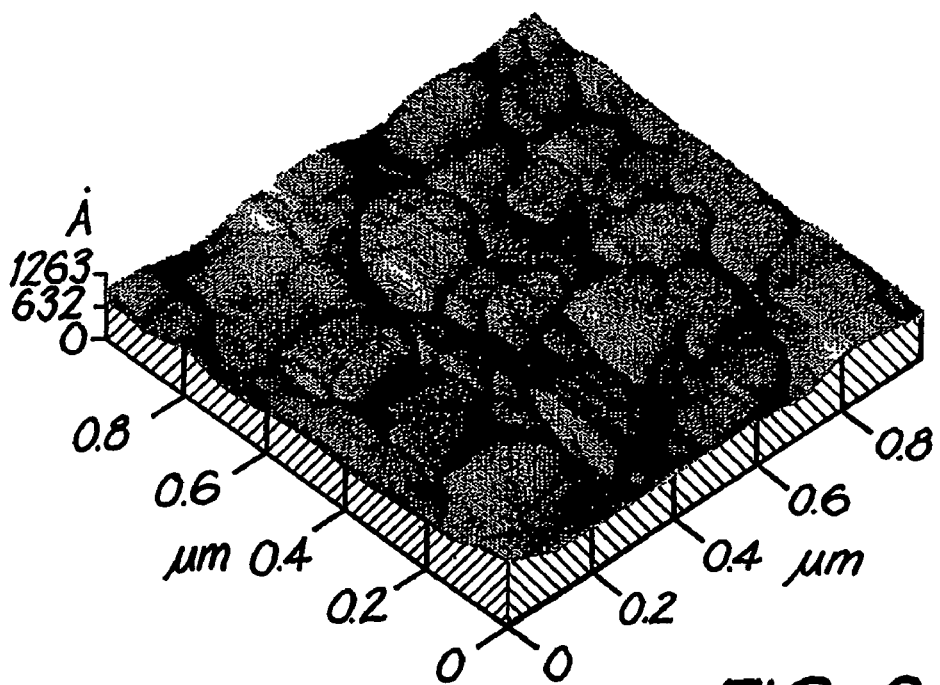
FIG. 6 shows an atomic force microscopy surface map of the gallium nitride sample B.
Figure 7:
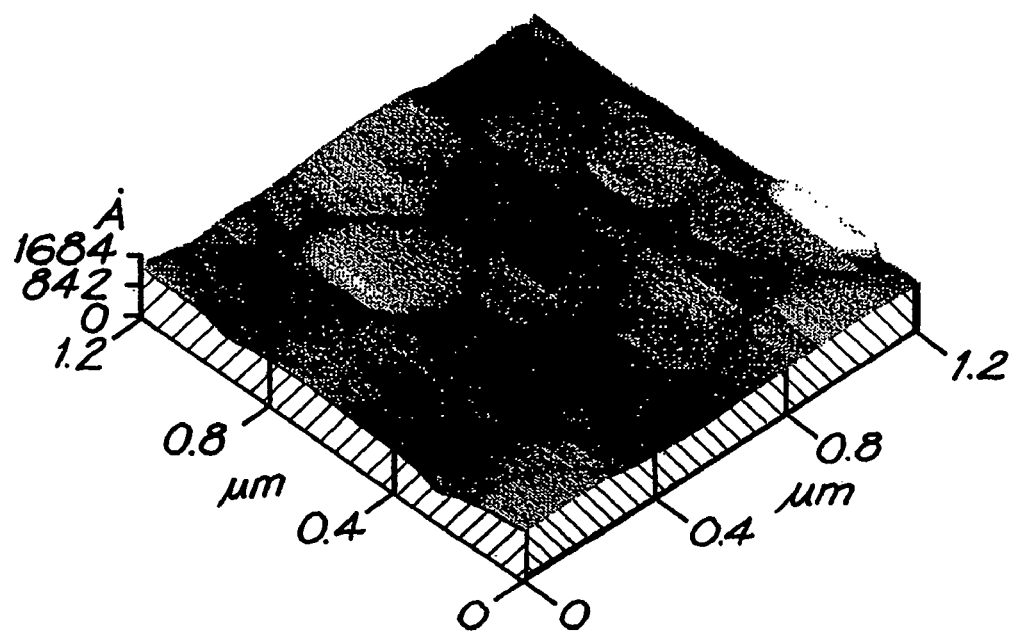
FIG. 7 shows an atomic force microscopy surface map of the gallium nitride sample C.

The AFM measurements show the morphology of the sample surface, for the same samples examined with XRD. FIG. 5 shows the AFM three-dimensional topology of sample A. The sample appears to show many small crystallites of approximately 25 nm average diameter. In FIG. 6 the topology of sample B, with lower oxygen is shown. For this sample there is an appreciable increase in the crystal size. The multiple crystal orientation evident in the XRD spectrum for sample B is also evident in the AFM topology with some crystallites having their c-axis parallel to the crystal surface.

FIG. 6 shows a three dimensional topological image of sample C. Again with the reduction in oxygen content, down to 2.4 at-% for this sample, there has been an increase in crystal size to an average of approximately 246 nm. The multi-orientations present for sample B with higher oxygen content have disappeared and the surface appears to have fairly uniform crystallinity. This is in accord with the XRD results, which show a single strong XRD peak indicative of a single dominant crystal orientation.

Figure 8:
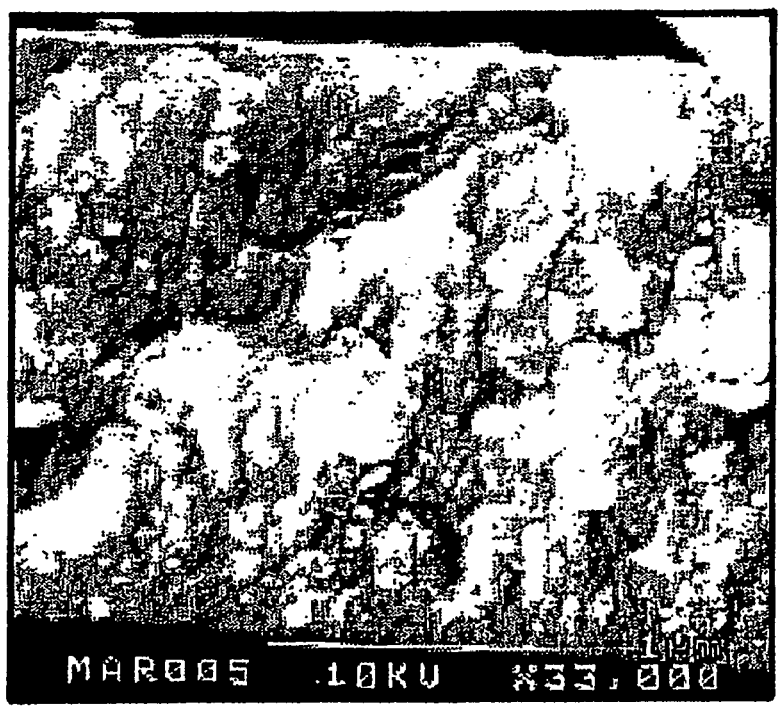
FIG. 8 shows a field emission gun SEM image, showing a cross-section of a gallium nitride film prior to recrystallization.

FIG. 8 shows a cross-section of a gallium nitride film prior to recrystallization, using a field emission gun SEM. It will be noticed that the film is still polycrystalline. Gallium nitride film, shown in cross-section using a field emission gun SEM. The film is shown prior to room temperature re-crystallisation.

Figure 9:
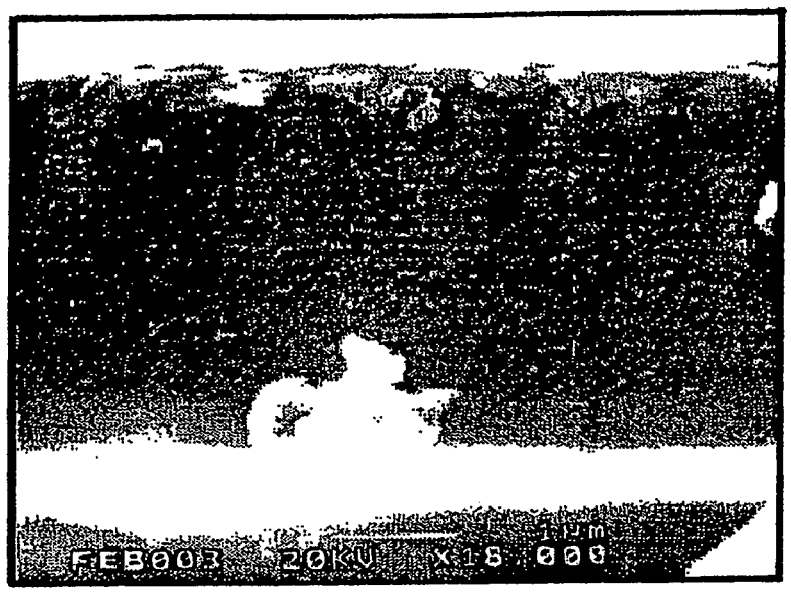
FIG. 9 shows a cross-section of gallium nitride film, after about two years of room temperature recrystallization.

FIG. 9 shows a cross-section of a gallium nitride film after two years. As in FIG. 8, a field emission gun SEM was used. Some recrystallization is noticeable. FEG-SEM cross-sectional view of gallium nitride film that has undergone room temperature re-crystallisation over a period of about two years. Some of the original crystal boundaries are still visible near the top of the film. The horizontal layering has yet to be investigated but is also a result of room temperature annealing.

Figure 10:
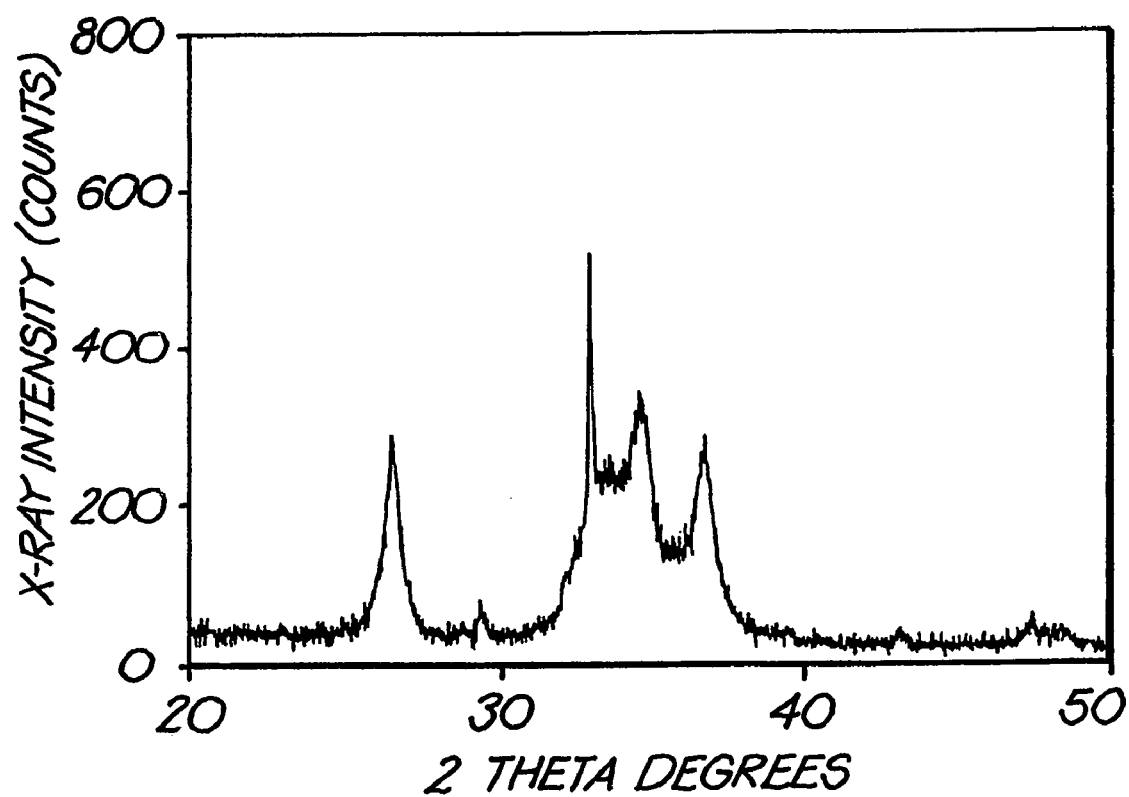
FIG. 10 shows an X-ray diffraction spectrum of a gallium nitride film, prior to recrystallization.

FIG. 10 shows an X-ray diffraction spectrum of gallium nitride film after growth. There are several broad peaks indicating multi-orientation and small crystal size.

Figure 11:
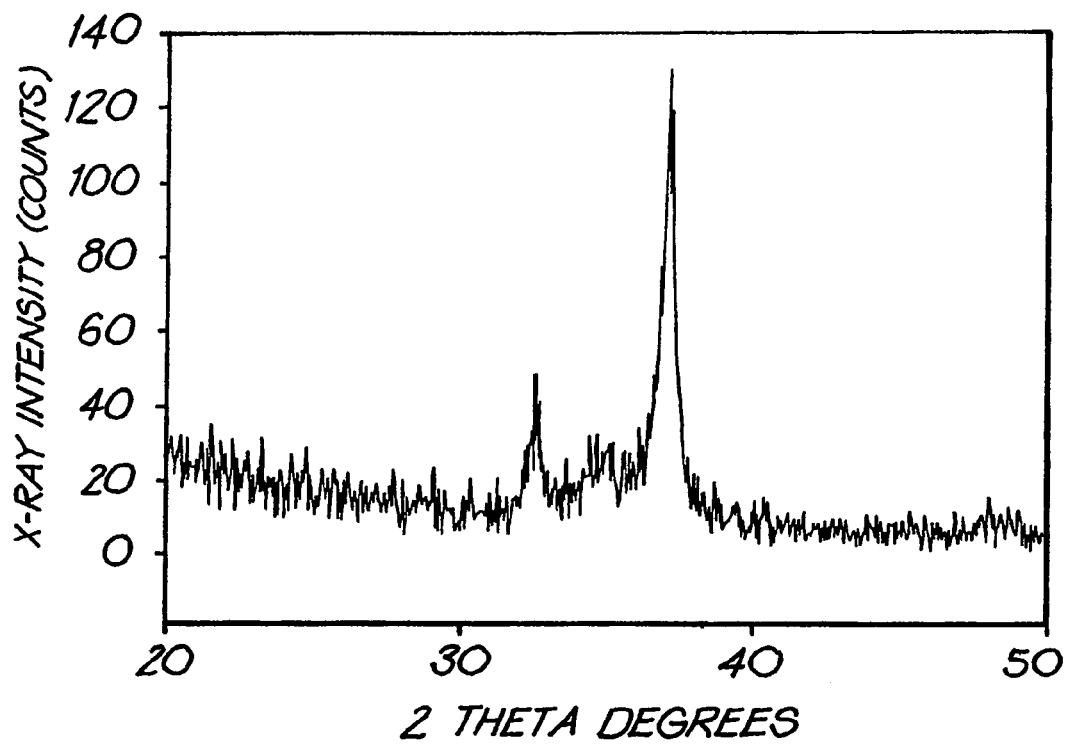
FIG. 11 shows an X-ray diffraction spectrum of a gallium nitride film, after about two years of recrystallization.

FIG. 11 shows an X-ray diffraction spectrum of gallium nitride after 2 years of room temperature annealing. The spectrum is now dominated by one major peak, indicating that the film has a preferred orientation, also the peak is narrower indicating improved sample crystallinity (bigger crystals). Residual polycrystalline regions at the film surface prevent a narrower diffraction peak from being collected for this sample.

Figure 12:
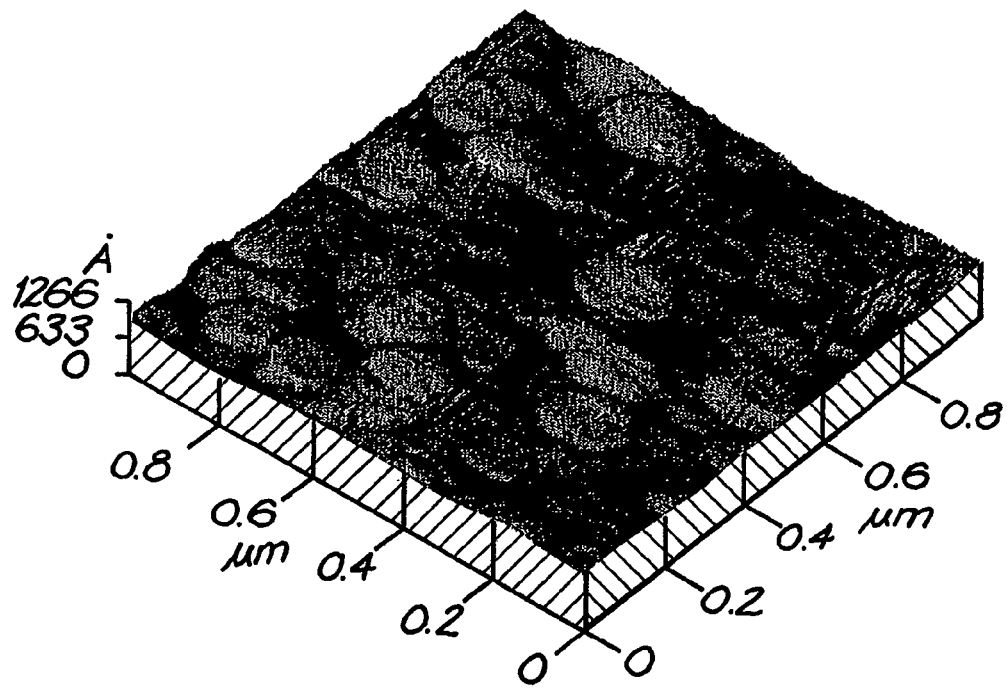
FIG. 12 shows an atomic force microscope image of a gallium nitride film, prior to recrystallization.

FIG. 12 shows an atomic force microscope image of gallium nitride surface soon after film growth. The image shows the tops of crystals approximately 100 nm in diametre.

Figure 13:
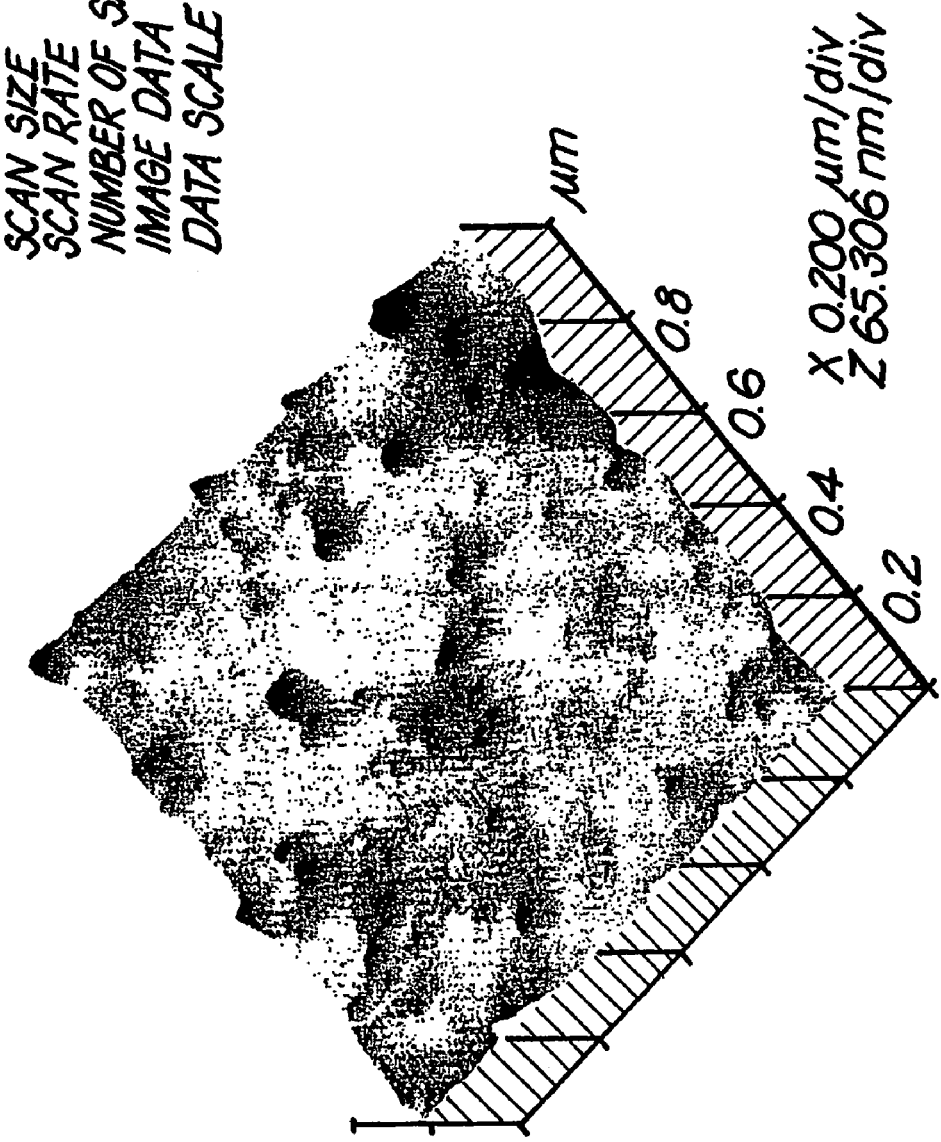
FIG. 13 shows an atomic force microscope image of gallium nitride film, about 18 months after growth.
Figure 14:
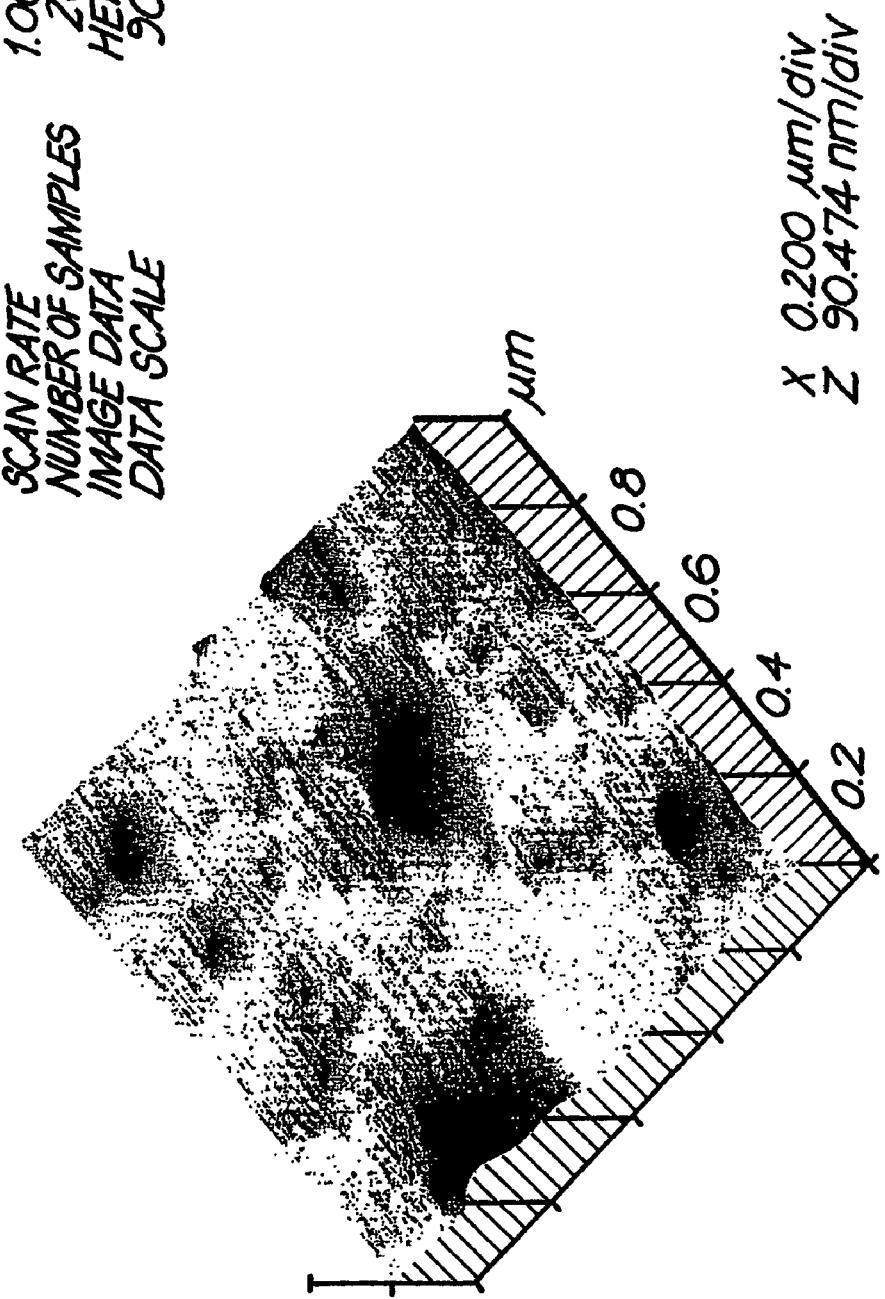
FIG. 14 shows an atomic force microscope image of a gallium nitride film, about 18 months after growth.

FIG. 13 shows an atomic force microscope image of the same gallium nitride surface 18 months after film growth. The image shows that the crystals are now indistinct. A better example (though an earlier AFM image of the same scale was not taken near growth—a larger image was) is shown below for a two year old sample, where the crystals appear to have coalesed even further.

Present gallium nitride device technology is based on, what in the literature is nominally described as, single crystal material, grown at temperatures generally above 950° C., on sapphire or SiC substrates [4]. However, these substrate materials tend to be expensive so that the cost effective application of present devices is limited. Growth at high temperatures also entails a large expenditure in temperature resistant growth equipment and ancillaries. Considerable savings and expansion in device use can be achieved by lower temperature growth, say below 650° C., on less expensive substrate materials. Although material quality is lower at such low growth temperatures, because polycrystalline material is prevalent when growing on low cost, temperature sensitive substrates, such as glass or silicon, polycrystalline material is of sufficient quality for device use for some applications. For example, Bour et al. [5] have demonstrated that a blue LED may be fabricated from polycrystalline GaN grown on quartz using a GaN buffer layer. Despite the aforementioned potential use, interest in polycrystalline GaN is small in comparison to that of single crystal material, and the knowledge base for this material is also correspondingly small. Material grown below 650° C. tends to be gallium rich because of the poor desorption of free gallium. [6-8] Therefore, the wider utilisation of this material is closely related to understanding the defect structure of gallium rich GaN.

Pearton et al and Ambacher [9, 10} suggest that oxygen acts as a shallow dopant in GaN and may be partially responsible for the unintentional n-type background doping of this material. However, growth conditions can play a strong role in determining how a foreign atom incorporates in a host matrix. For instance, oxygen is known to take part in the formation of point defects for arsenic rich GaAs grown by molecular beam epitaxy (MBE) or metalorganic chemical vapour deposition (MOCVD) [11]. However in GaAs grown by liquid phase epitaxy (LPE), under gallium rich conditions, oxygen behaves as a shallow donor [12]. As a result of this the deep level trap density is suppressed in LPE GaAs and the minority carrier diffusion length—a measure of material purity—can be several orders of magnitude higher than for arsenic rich GaAs [13].

Gallium rich GaN is easily obtained at temperatures below 750° C. because below that temperature free gallium has an extremely low desorption rate [6-8]. GaN buffer layers are commonly grown under Ga rich conditions, since the presence of excess gallium in the buffer layer improves the buffer layer morphology and has lead to an improvement in the photoluminescence of subsequently deposited layers [14]. Gallium rich growth conditions are also easily achieved in MBE growth where surface accumulations of free Ga have been observed under low temperature conditions [8]. In fact, slightly Ga rich conditions, below 750° C., are often sought because of the improved morphology of the layers [6, 10]. There is therefore considerable interest in Ga rich GaN.

The invention provides a process for the manufacture of a gallium nitride film, which includes the step of growing the film in an environment in which the oxygen concentration is low. This process results in the formation of a gallium rich film, with high gallium mobility, which is surprising, based on the experience gained from the films of GaAs grown under similar circumstances. In GaN one would expect oxygen to behave in a different manner dependent upon the material stoichiometry. Theoretical studies that calculate the formation energy for various defects in GaN often provide them as a function of the Fermi level of GaN. Quite large changes in formation energy are reported for some defects as the Fermi level scans the band-gap (see for example reference 15). Compensation and localised Coulombic effects may complicate such dependencies so that gallium rich GaN must be treated uniquely. In fact many theoretical studies have already examined this specific case. The role of oxygen in gallium rich material appears to have a strong relationship to the defect structures present in the material. Threading dislocations are a major defect present in GaN and so their potential interaction with oxygen is briefly reviewed here.

Leung, Wright and Stechel [16] carried out Monte Carlo simulations, explicitly taking into account Coulomb interactions, to determine the structure of threading dislocations in GaN. They concluded that under gallium rich growth conditions nitrogen vacancies are likely to be present at dislocation sites, whereas for nitrogen rich material gallium vacancies are likely to be present. Lee et al [17], however, carried out self-consistent-charge density-functional-based tight-binding (SCC-DFTB) calculations, which indicated that the so called 'open core' and 'full core' type threading dislocations should be most prevalent under Ga rich conditions, with the nitrogen vacancy being a special case that occurs only under extreme Ga rich conditions. The open core and full core dislocations themselves are both associated with large numbers of Ga and N vacancies. Lee et al, however, assumed that no impurity species were present for their calculations, but suggested the possibility of oxygen being associated with these dislocations based on earlier work [18]. This earlier work was performed by Elsner et al. [18] who also carried out SCC-DFTB calculations. The findings of Elsner et al. may be particularly relevant to understanding the results of this study. These authors assert, in a number of papers [18-21], that for Ga rich GaN growth conditions, with sufficient available oxygen, it is energetically favourable for a gallium vacancy defect, complexed with three oxygen atoms on nitrogen sites, ie $V_{Ga}$—$(O_N)_3$, to form at threading dislocations. This defect complex is apparently very stable once formed and is electrically inactive. The associated $(V_{Ga}$—$(O_N))^{2-}$ and $(V_{Ga}$-$(O_N)_2)^{1-}$ complexes were also thought to form though calculations show that these are less stable and should respectively be deep double acceptor and deep single acceptor defects [18]. Segregation of these defect complexes at dislocation sites was believed to occur because the formation energies were more favourable within the stress-field of the dislocation sites than in the bulk material [18]. It was further suggested that the presence of the electrically inactive $V_{Ga}$—$(O_N)_3$ complex inhibits overgrowth by GaN [20] so that the defects grow parallel to the c axis.

There is some experimental verification of the models proposed by Elsner et al.: Oila et al. [22] used low energy positron beam analysis and SIMS (secondary ion mass spectroscopy) to study vacancy formation in GaN and found that the Ga vacancy concentration increased in the presence of oxygen for n-type GaN. This suggests that stable Ga vacancy-oxygen complexes may have formed. Liliental-Weber et al. also noted an increase in the density of GaN nanotube defects with the addition of oxygen [23], possibly providing evidence that these complexes tend to segregate and form extended is defect structures.

In gallium rich GaN, oxygen defect complex formation with Ga vacancies may be prevalent, and there may be segregation of these complexes at dislocation sites. The open core and full core dislocations provide an adequate supply of Ga vacancies for the complexes to form in Ga rich films.

For the GaN films examined in Example 1, the above data show an increase in crystal size with lower oxygen content. The inventors suggest that this might be due to the segregation of oxygen at the crystal boundaries. A similar model of oxygen segregation at the grain boundaries has been proposed for polycrystalline AlN [24], which is chemically similar to GaN, but in that case it was suggested that the oxygen was incorporated as a result of post-growth ex-situ exposure to air. In the present invention, it is suggested by the inventors that the oxygen is incorporated pre-dominantly during growth, as controlled by the background ambient pressure of the chamber (see table 1). Their suggestion of oxygen segregation during growth is supported by the work of Elsner et al. [18-21], who were able to show that the segregation of oxygen by the formation of $V_{Ga}$—$(O_N)_n$ complexes is energetically favourable. Those authors further suggested that the formation of these complexes inhibited any overgrowth by GaN so that segregated collections of the complexes extended to the film surface as dislocations running parallel to the c-axis of the film. The results found by the inventors may be seen as partial confirmation of the theoretical work of Elsner et al., with one difference being that when the process according to the invention is conducted in the presence of relatively large amounts of oxygen segregation occurs at polycrystalline boundaries and not just at threading dislocations. The greater amount of oxygen present has allowed the coalescence of dislocations. With less oxygen present, fewer grain boundaries result and larger crystallites are formed. It is expected by the inventors that, in the presence of even smaller amounts of oxygen than that studied in Example 1, dislocation defects will form in place of grain boundaries (in the absence of film strain related to the substrate-film lattice mismatch). Sufficient atomic mobility must of course be present at the growth temperature for oxygen to migrate to a suitable lattice site.

Direct evidence of this model, by elemental mapping would be difficult to obtain considering the dimensions of the crystals and the spatial resolution required to distinguish oxygen at the grain boundary. However, if the model holds true there should be some relationship between the surface areas of the crystals and the total oxygen content of the film. Therefore in order to confirm the model we can carry out some simplified calculation of the expected oxygen content of the film based on the available intergranular surface area and then check this against the known oxygen content found by the ERD analysis.

An approximate calculation was carried out in the following manner. For sample C, assuming c-axis oriented crystals that are continuous through the thickness of the film, but have an "a" axis diameter (D) of 246 nm, then the volume and available surface area of the crystals (excluding the top and bottom surfaces of the crystals, since only the bulk is of interest) can be found and used for the calculation. The crystal volume can be divided by the number of unit cells for the hexagonal GaN structure using the lattice constants a=3.186 Å and c=5.178 Å (taken from the JCPDS-ICDD PDF-2 database). The volume (V) of the unit cell is given by $$V = \frac{a^2 c \sqrt{3}}{2} \quad (1)$$

where there are two GaN molecules per unit cell volume. The number of unit cells (N) that can be accommodated in our crystal volume is therefore given by $$N = L \cdot \pi \cdot (D/2)^2 / V \quad (2)$$

$$= 5.41 \times 10^5$$

where L is the height of the crystals, in this case for simplicity taken to be the unit crystal height equal to "c". This yields a total of $1.08 \times 10^6$ gallium atoms, since there are two gallium atoms per unit cell. There is also the same number of nitrogen atoms in our crystal volume. The minimum number of unit cells ($N_S$) at the crystal surface (excluding the top and bottom surfaces of the crystal which are at the film surface and not representative of the bulk oxygen) is given by $$N_S = D \cdot \pi \cdot l / a \quad (3)$$
$$= 2505$$

Assuming the crystal surfaces are terminated by the oxygen related $V_{Ga}$—$(O_N)_3$ complex mentioned previously, then for each of the two gallium atoms missing as vacancies from a unit cell we should expect 6 related oxygen atoms. This is the case regardless of whether or not all the oxygen atoms are contained in the unit cell. Three separate oxygen atoms are required for each vacancy in order to maintain charge neutrality. This gives us a total of 15030 oxygen atoms at the surface of our crystal, therefore, as an atomic percentage of composition, the total oxygen content on the outside of the crystal (in the bulk) can be found by the following calculation $$at\text{-}\% \text{ oxygen} = 100(6N_S / (4N - 2N_S)) \quad (4)$$
$$= 100(15030 / (4 \times 5.41 \times 10^5 - 2 \times 2505))$$
$$= 0.70 \ at\text{-}\%.$$

where the second term in the denominator of equation 4 takes into account the gallium vacancies present at the crystal surface. Doubling this figure to take into account the oxygen termination on adjoining crystals gives a total oxygen content of 1.4 at-% for the film. This value agrees reasonably well with the oxygen content of sample C given by the ERD results (see table 1), and for which the AFM results indicate an average crystal diameter of approximately 246 nm.

A similar calculation was performed for sample B. However, for sample B the crystals did not extend over the length of the film. The oxygen content therefore had to be calculated for the total surface area of a typical crystal. Assuming an idealised typical crystal of cylindrical volume, with 50 nm diameter (D) and 150 nm length (L), then N was given as before by equation 2, though this time yielding $$N = 6.47 \times 10^6$$

giving a total of $1.29 \times 10^7$ gallium atoms and the same number of nitrogen atoms for the total crystal volume. For this case, the minimum number of unit cells ($N_S$) at the crystal surface is given by $$N_S = 2\pi (D/2)^2 / (0.866a^2) + (D \cdot \pi \cdot L)/(ac) \quad (5)$$
$$= 1.87 \times 10^5$$

again assuming 6 oxygen atoms associated with each unit crystal at the sample surface yields a total of $1.12 \times 10^6$ oxygen atoms. Using equation 4 and again doubling the result because of the presence of adjoining crystals yields a total oxygen content of 8.8 at-% for the film. Given the inaccuracies involved in this approximate calculation, and the error present for the ERD analysis, the agreement between this calculated value and the ERD results (see table 1) is excellent.

A similar calculation was made for sample A, and assuming 25 micron diameter 25 micron length cylindrical crystals yields a film with a 26.8 at-% oxygen content. This is again in reasonable agreement with the ERD analysis data of table 1.

From the approximate calculations made above we can see that the available surface area at the polycrystalline boundaries can indeed accommodate a significant portion of the oxygen in these gallium rich GaN films. Formation of the $V_{Ga}$—$(O_N)_3$ defect complex, which previous calculations by Elsner et al. [18-21] have shown to be energetically stable, to be electrically neutral and to segregate at defect sites, is indicated by the present calculations since this defect complex provides adequate oxygen sites at the crystal surface to account for the measured values of film oxygen content. The incorporation of oxygen during growth therefore appears to have a strong influence on the size of crystals for GaN. Given that the oxygen segregates at grain boundaries, and if substrates with low lattice mismatch, or appropriate buffer layers, are available, then lowering the oxygen content of the films should result in larger crystals or even single crystal material at low growth temperatures. For the material grown here on silicon, however, it is expected that only a moderate gain in crystal size can be obtained by further lowering of the films oxygen content, as the lattice mismatch between pure GaN and Si is large at 20% [25].

The inventors also considered whether, in the absence of oxygen, other impurity species such as carbon or hydrogen would behave in a similar manner at dislocation or grain boundary sites. The presence of these species has been largely ignored in Example 1 since the oxygen content has been greater for all but film C. Though it could not be proven with certainty for the samples of Example 1, it is probable that a considerable proportion of the carbon and hydrogen was adventitious with these smaller atoms being absorbed through voids present at the grain boundaries on ex-situ exposure of the films to the ambient. The ERD results show that the hydrogen and carbon contents have been non-negligible. Certainly, hydrogen is known to take up dangling bonds in III-V group materials and to be present at percentage levels in GaN [9]. Whether hydrogen would actively contribute to grain boundary or dislocation formation, as oxygen apparently does, is perhaps less likely due to the smaller size of the atom and the lower propensity for Ga—H bonds compared to Ga—O bonds. However, the inventors do not discount this process totally as it may still be apparent in certain growth regimes though to a much lesser extent.

The 2.4 at-% oxygen level of sample C represents the lowest oxygen incorporation level for the samples grown by RPE-LICVD for this study. Despite this level of oxygen incorporation, good quality polycrystalline material was realised. The formation of an electrically neutral $V_{Ga}$—$(O_N)_3$ defect complex would explain the reasonable mobilities obtained for this material, at moderate carrier concentration, in the presence of such high oxygen levels.

ERD measurements of film oxygen composition have been shown to be correlated with crystal size for gallium rich GaN. Larger crystal sizes are achieved with reduced oxygen, as controlled, in this case, by the background vacuum level. In agreement with the work of Elsner et al. [18-21], the oxygen is believed to segregate at defect sites, predominantly as $V_{Ga}$—$(O_N)_3$ defect complexes. In this case however the defect sites are crystalline boundaries. A comparison of measured oxygen content with the calculated available surface area of crystals in the polycrystalline GaN films has shown that a significant proportion of the available oxygen can be accommodated at the grain boundaries. The GaN was grown in a temperature range (~540° C.) where it is expected to be gallium rich. This is believed to be an important aspect of this type of oxygen incorporation. There is at present no evidence to suggest that similar segregation should occur for stoichiometric or nitrogen rich GaN.

Following extended periods of room temperature annealing (greater than 18 months) some of the films no longer appeared to be polycrystalline and were found to have higher conductivity. It is believed that these preliminary results are a manifestation of the room temperature mobility of free gallium in gallium nitride. This improvement in film quality following room temperature annealing indicates that high temperatures may be unnecessary for the production of high quality gallium nitride and that such layers may potentially be grown on silicon, or any of a number of substrate materials, without the need of buffer layers.

Gallium rich gallium nitride (GaN) grown under certain low temperature growth conditions will thus self-anneal at room temperature or can be purposely annealed at temperatures above room temperature to improve the electronic and crystallographic properties of the GaN. This appears to be a room temperature re-crystallisation process. This invention is significant in that it may allow the production of high quality GaN from material grown at temperatures below 650 degrees Celsius. At present best quality GaN is grown at temperatures above 950 degrees Celsius on sapphire or silicon carbide substrates. The production of high quality GaN from material grown at lower temperatures will allow access to less expensive substrates, which will lower production costs for this material.

The as grown material is generally polycrystalline with poor conductivity. If the material is grown under the correct conditions then it will undergo a re-crystallisation process at room temperature. The time period for this process may be shortened by higher temperature annealing. The process has been observed to improve the material crystallinity and the conductivity.

Example 2

The attached pictures shows examples, by a number of different measurement techniques, of room temperature re-crystallization observed.

The pictures show a lot of small crystals, evidencing a polycrystalline nature shortly after growth, and a much less polycrystalline nature after two years.

Example 3

Gallium Nitride Films Grown on Sapphire Substrates

Samples were grown on non-conducting sapphire substrates so that sample conductivity measurements could be made. The growth conductions used were the same as for the samples grown on silicon described in example 1 and 2 above.

Electrical measurements were made of the conductivity of samples of gallium nitride grown using the above technique. Some re-crystallization took place in a sample that was semi-insulating (resistivity more than 10,000 ohm-cm) shortly after growth and became much more conductive (86 ohm-cm) about two years later.

For the growth of this sample on sapphire, the above conditions produced gallium rich films under low oxygen conditions. A slightly yellow colouration was noted. This colouration was similar to that observed for gallium rich bulk grown gallium nitride [26].

Example 4

Gallium Nitride Films Grown on Glass Substrates with ZnO Buffer Layers

Gallium nitride was grown on glass substrates with ZnO buffer layers using only RPECVD. The gallium nitride films were grown at 650° C. on the soda lime glass with ZnO buffer layer. A Hall Van der Pauw measurement system was used for electrical measurements. The best previous results for GaN film growth on glass, that we are aware of, were those of Asahi et al. [27] who had obtained an n-type carrier mobility of 23.8 $cm^2/V \cdot sec$ for Si doped material with a carrier concentration of $1 \times 10^{17}$ $cm^{-3}$ when depositing the gallium nitride on pure fused silica using a low temperature gallium nitride buffer layer. A similar mobility of 19 $cm^2/V \cdot sec$ was obtained for undoped n-type material with a carrier concentration of $1.3 \times 10^{17}$ $cm^{-3}$. In that case, the glass substrate had higher impurity content and no Si doping was used, so that this is an excellent result for film growth using a ZnO buffer layer.

REFERENCES

[1] Bing Zhou, Xin Li, T. L. Tansley and K. S. A. Butcher Appl. Surf. Sci. 100/101 (1996) 643.
[2] H. Timmers, T. R. Ophel, and R. G. Elliman, Nucl. Instr. Meth. B 161-163 (2000) 19.
[3] R. G. Elliman, H. Timmers, T. R. Ophel T. D. M. Weijers, L. S. Wielunski, and G. L. Harding, Nucl. Instr. Meth. B 161-163 (2000) 231.
[4] J. W. Orton and C. T. Foxon, Rep. Prog. Phys. 61 (1998) 1.
[5] D. P. Bour, N. M. Nickel, C. G. Van de Walle, M. S. Kneissl, B. S. Krusor, Ping Mei, and N. M. Johnson, Appl. Phys. Lett. 76 (2000) 2182.
[6] S. Guha, N. A. Bojarczuk and D. W. Kisker, Appl. Phys. Lett. 69 (1996) 2879.
[7] K. R. Evans, T. Lei and C. R. Jones, Solid-State Electron. 41 (1997) 339.
[8] A. V. Blant, S. V. Novikov, T. S. Cheng, L. B. Flannery, I Harrison, R. P. Campion, D. Korakakis, E. C. Larkins, Y. Kribes and C. T. Foxon, J. Crystal Growth 203 (1999) 349.
[9] S. J. Pearton, J. C. Zolper, R. J. Shul and F. Re, J. Appl. Phys. 86 (1999) 1.
[10] O. Ambacher, J. Phys. D: Appl. Phys. 31 (1998) 2653.
[11] H. Ch. Alt, Mater. Sci. Frum 83-87 (1992) 369.
[12] K. S. A. Butcher, L. Mo, D. Alexiev and T. L. Tansley, J. Crystal Growth 156 (1995) 361.
[13] K. S. A. Butcher, D. Alexiev and T. L. Tansley, Aust. J. Phys. 46 (1993) 317.
[14] Y. Kim, S. G, Subramanya, H. Siegle, J. Kruger, P. Perlin, E. R. Weber, S. Ruvimov and Z. Liliental-Weber, J. Appl. Phys. 88 (2000) 6032.
[15] C. G. Van de Walle, J. Neugebauer and C. Stampfl, "Native Point Defects in GaN and Related Compounds" in "Gallium Nitride and Related Semiconductors" edited by J. H. Edgar, S. Strite, I. Akasaki, H. Amano and C. Wetzel (INSPEC, London, 1999) 281.
[16] K. Leung, A. F. Wright and E. B. Stechel, Appl. Phys. Lett. 74 (1999) 2495.
[17] S. M. Lee, M. A. Belkhir, X. Y. Zhu, Y. H. Lee, Y. G. Hwang and T. Frauenheim, Phys. Rev. B 61 (2000) 16033.
[18] J. Elsner, R. Jones, M. I. Heggie, P. K. Sitch, M. Haugk, Th. Frauenheim, S. Oberg and P. R. Briddon, Phys. Rev. B 58 (1998) 12571.

[19] J. Elsner, R. Jones, M. Haugk, R. Gutierrez, Th. Frauenheim, M. I. Heggie, S. Oberg and P. R. Briddon, Appl. Phys. Lett. 73 (1998) 3530.
[20] R. Gutierrez, M. Haugk, Th. Frauenheim, J. Elsner, R. Jones, M. I. Heggie, S. Oberg and P. R. Briddon, Phil. Mag. Lett. 79 (1999) 147.
[21] A. T. Blumenau, J. Elsner, R. Jones, M. I. Heggie, S. Oberg, T. Frauenheim and P. R. Briddon, J. Phys.: Condens: Matter 12 (2000) 10223.
[22] J. Oila, V. Ranki, J. Kivioja, K. Saarinen, P. Hautojarvi, J. Likonen, J. N. Baranowski, K. Pakula, T. Suski, M. Leszczynski and I. Grzegory, Phys. Rev. B 63 (2001) 045205.
[23] Z. Liliental-Weber, Y. Chen, S. Ruvimov and J. Washburn, Phys. Rev. Lett. 79 (1997) 2835.
[24] M. Kishi, M. Suzuki and K. Ogawa, Jpn. J. Appl. Phys. 31 (1992) 1153.
[25] H. Okumura, "Cubic Substrates for Growth of GaN and Related Compounds" in "Gallium Nitride and Related Semiconductors" edited by J. H. Edgar, S. Strite, I. Akasaki, H. Amano and C. Wetzel (INSPEC, London, 1999) 402.
[26] Z. Liliental-Weber et al., Proc. Topical Workshop on III-V Nitrides (TWN95) Eds. I. Akasaki and K. Onabe (Elsevier Science Ltd, 1997) p. 167.
[27] H. Asahi, K. Iwata, H. Tampo, R. Kuroiwa, M. Hiroki, K. Asami, S. Nakamura, S. Gonda, J. Crystal Growth 201/202 (1999) 371.

The invention claimed is:

1. A process for the manufacture of a gallium rich gallium nitride film, comprising:
    (a) preparing a reaction mixture containing a gallium species and a nitrogen species, the gallium species and the nitrogen species being selected such that, when they react with each other, gallium nitride is formed; and
    (b) growing the gallium rich gallium nitride from said reaction mixture, by allowing the gallium species to react with the nitrogen species and to deposit gallium nitride on a substrate, at a temperature of from about 480° C. to about 900° C. and in the presence of a gaseous environment in which the partial pressure of oxygen is less than $10^{-4}$ Torr,
    wherein the ratio of gallium atoms to nitrogen atoms in the gallium rich gallium nitride film is from 1.01 to 1.20.

2. A process for the manufacture of a gallium rich gallium nitride film as claimed in claim 1 wherein, in step (b), the temperature is between 500° C. and 650° C.

3. A process for the manufacture of a gallium rich gallium nitride film, comprising;
    (a) preparing a reaction mixture containing a gallium species and a nitrogen species, the gallium species and the nitrogen species being selected such that, when they react with each other, gallium nitride is formed; and
    (b) growing the gallium rich gallium nitride film from said reaction mixture, by allowing the gallium species to react with the nitrogen species and to deposit gallium nitride on a substrate, at a temperature of from about 480° C. to about 650° C. and in the presence of a gaseous environment in which the partial pressure of oxygen is less than $10^{-4}$ Torr, wherein the ratio of gallium atoms to nitrogen atoms in the gallium rich gallium nitride film is from 1.001 to 1.20; and
    (c) annealing the said film at a temperature of from about 20° C. to about 700° C. for a time sufficient to decrease the resistivity of the gallium rich gallium nitride film to below 1000 ohm·cm.

4. A process for the manufacture of a gallium rich gallium nitride film as claimed in claim 1 or claim 3, wherein, in step (b), the temperature is about 570° C.

5. A process for the manufacture of a gallium rich gallium nitride film as claimed in claim 1 or claim 3, wherein, in step (b), the partial pressure of oxygen is less than $10^{-6}$ Torr.

6. A process for the manufacture of a C gallium nitride film as claimed in claim 1 or claim 3, wherein, in step (b), a laser is used to induce the deposition on the substrate of the gallium nitride formed by the reaction mixture.

7. A process for the manufacture of a gallium rich gallium nitride film as claimed in claim 1 or claim 3, wherein a remote plasma is used to assist with the deposition of gallium nitride from the reaction mixture.

8. A process for the manufacture of a gallium rich gallium nitride film as claimed in claim 3, wherein, during the annealing step (c), the resistivity of the film is reduced to less than 250 ohm·cm.

9. A process for the manufacture of a gallium rich gallium nitride film as claimed in claim 8, wherein, during the annealing step (c), the resistivity of the film is reduced to less than 90 ohm·cm.

10. A process for the manufacture of a gallium rich gallium nitride film as claimed in claim 3, wherein, during the annealing step (c), the annealing temperature is from about 50° C. to about 500° C.

11. A process for the manufacture of a gallium rich gallium nitride film as claimed in claim 3, wherein, the annealing step (c) is carried out at a temperature between about 20° C. and about 650° C. and for a time period selected to obtain a film having crystallographic characteristics acceptable for use in a laser device.

12. A process for the manufacture of a gallium rich gallium nitride film as claimed in claim 3, wherein the annealing step (c) is carried out at a temperature between about 20° C. and about 650° C. and for a time period selected to decrease the resistivity of the gallium rich gallium nitride film to below 1000 ohm·cm.

13. A process for the manufacture of a gallium rich gallium nitride film as claimed in claim 1 or claim 3, wherein, in step (a), the reaction mixture is prepared from ammonia and trimethylgallium.

14. A process for the manufacture of a gallium rich gallium nitride film as claimed in claim 1 or claim 3, wherein in step (a), the reaction mixture is prepared from ammonia and trimethylgallium, and wherein additional active nitrogen is provided by a remote nitrogen plasma maintained at microwave frequencies.

15. A process for the manufacture of a gallium rich gallium nitride film as claimed in claim 1 or claim 3, wherein in step (b), the total pressure is between 0.1 Torr and 15 Torr.

16. A process for the manufacture of a gallium rich gallium nitride film as claimed in claim 1 or claim 3, wherein in step (b), the total pressure is between 1.0 Torr and 2.0 Torr.

17. A process for the manufacture of a gallium rich gallium nitride film as claimed in claim 1 or claim 3, preceded by a step in which the growth chamber is evacuated to an absolute pressure of between $1.0 \times 10^{-5}$ Torr and $1.0 \times 10^{-8}$ Torr, before the reaction mixture is introduced.

18. A process for the manufacture of a gallium rich gallium nitride film as claimed in claim 1 or claim 3, preceded by a step in which the growth chamber is purged with nitrogen followed by a step in which the growth chamber is evacuated to an absolute pressure of between $1.0 \times 10^{-5}$ Torr and $1.0 \times 10^{-8}$ Torr, before the reaction mixture is introduced.

* * * * *